US012681098B2

(12) United States Patent
Geiss

(10) Patent No.: US 12,681,098 B2
(45) Date of Patent: Jul. 14, 2026

(54) METHOD OF DETERMINING A REMAINING OPERATING TIME OF AN ELECTRICAL ENERGY STORAGE UNIT IN AN AIRCRAFT

(71) Applicant: AIRBUS HELICOPTERS DEUTSCHLAND GMBH, Donauwörth (DE)

(72) Inventor: Michael Geiss, Möttingen (DE)

(73) Assignee: AIRBUS HELICOPTERS DEUTSCHLAND GMBH, Donauworth (DE)

( * ) Notice: Subject to any disclaimer, the term of this patent is extended or adjusted under 35 U.S.C. 154(b) by 165 days.

(21) Appl. No.: 18/655,535

(22) Filed: May 6, 2024

(65) Prior Publication Data

US 2025/0076395 A1 Mar. 6, 2025

(30) Foreign Application Priority Data

Aug. 31, 2023 (EP) .................................... 23194568

(51) Int. Cl.
  G01R 31/3842 (2019.01)
  B60L 58/12 (2019.01)
  (Continued)

(52) U.S. Cl.
  CPC .......... G01R 31/3842 (2019.01); B60L 58/12 (2019.02); G01R 31/3646 (2019.01);
  (Continued)

(58) Field of Classification Search
  CPC ...... G01R 31/00; G01R 31/005; G01R 31/36; G01R 31/3644; G01R 31/3646;
  (Continued)

(56) References Cited

U.S. PATENT DOCUMENTS 10,682,677 B2 * 6/2020 Sen .......................... B08B 13/00
11,132,476 B2 * 9/2021 Colas ...................... G06F 30/15
(Continued)

FOREIGN PATENT DOCUMENTS

CN 116534260 A 8/2023
EP 3073340 A1 9/2016
(Continued)

OTHER PUBLICATIONS

European Search Report for European Application No. EP 23194568. 4, Completed by the European Patent Office, Dated Feb. 15, 2024, 8 pages.

*Primary Examiner* — Hoai-An D. Nguyen
(74) *Attorney, Agent, or Firm* — BROOKS KUSHMAN P.C.

(57) ABSTRACT

A method of determining a remaining operating time of an electrical energy storage unit in an aircraft, comprising: using a first sensor arrangement for measuring first performance parameters of the electrical energy storage unit; determining first performance indicators based on the first performance parameters; using at least one second sensor arrangement for measuring second performance parameters of the electrical energy storage unit; determining second performance indicators based on the second performance parameters; comparing the first performance indicators with the second performance indicators to determine consolidated performance indicators; and determining predictive remaining operating times of the electrical energy storage unit based on the consolidated performance indicators, wherein the predictive remaining operating times comprise at least a predictive nominal remaining operating time and a predictive emergency remaining operating time.

20 Claims, 11 Drawing Sheets

(51) Int. Cl.

| | |
|---|---|
| *B64C 27/04* | (2006.01) |
| *B64D 27/357* | (2024.01) |
| *G01R 31/36* | (2020.01) |
| *G01R 31/374* | (2019.01) |

(52) U.S. Cl.
CPC ........ *G01R 31/374* (2019.01); *B60L 2200/10* (2013.01); *B60L 2240/54* (2013.01); *B64C 27/04* (2013.01); *B64D 27/357* (2024.01)

(58) Field of Classification Search
CPC ............... G01R 31/374; G01R 31/382; G01R 31/3842; G01R 35/00; G01R 35/005; B60L 3/00; B60L 58/00; B60L 58/10; B60L 58/12; B60L 58/14; B60L 58/16; B60L 2200/00; B60L 2200/10; B60L 2240/00; B60L 2240/40; B60L 2240/54; B64C 27/00; B64C 27/04; B64D 27/00; B64D 27/02; B64D 27/30; B64D 27/35; B64D 27/357; H02J 7/00; H02J 7/0047; H02J 7/0048

USPC ......................................... 324/425, 426, 431
See application file for complete search history.

(56) References Cited

U.S. PATENT DOCUMENTS

| | | | | |
|---|---|---|---|---|
| 12,537,241 | B2 * | 1/2026 | Tadepalli | ........... G05D 23/1917 |
| 12,578,396 | B2 * | 3/2026 | Lee | ....................... G01R 31/392 |
| 2022/0299569 | A1 | 9/2022 | Kurtz et al. | |
| 2023/0054549 | A1 | 2/2023 | Foland et al. | |
| 2023/0222925 | A1 | 7/2023 | Foland et al. | |
| 2026/0004124 | A1 * | 1/2026 | Noh | ........................... G06N 3/08 |
| 2026/0030393 | A1 * | 1/2026 | Rackauckas | ............. G06F 30/10 |
| 2026/0079209 | A1 * | 3/2026 | Lee | ....................... G01R 31/367 |

FOREIGN PATENT DOCUMENTS

| | | | | |
|---|---|---|---|---|
| EP | | 3998486 A1 | 5/2022 | |
| JP | | 2025105065 A | * 7/2025 | ............. B60K 35/81 |

* cited by examiner

1

METHOD OF DETERMINING A REMAINING OPERATING TIME OF AN ELECTRICAL ENERGY STORAGE UNIT IN AN AIRCRAFT

CROSS-REFERENCE TO RELATED APPLICATIONS

This application claims priority to European patent application No. EP 23194568.4 filed on Aug. 31, 2023, the disclosure of which is incorporated in its entirety by reference herein.

TECHNICAL FIELD

The disclosure is related to a method of determining a remaining operating time of an electrical energy storage unit in an aircraft.

BACKGROUND

Electrical energy storage units which are used in aeronautic applications are currently increasingly widespread, for instance as supply sources of electrical propulsion systems, supply sources of on-board power networks, supply sources of on-board backup and/or emergency systems, supply sources of electrical motors and/or starter machines cranking up thermal engines, etc. Thereby, a respective electrical energy storage unit may be provided with one or more electrical energy sources, such as batteries, capacitors, or equivalent energy storage components.

Monitoring of an electrical energy storage unit for determining e.g., a remaining useful energy of the electrical energy storage unit is well-known. For instance, the document US 2023/0054549 A1 describes methods for determining remaining useful energy in an electric aircraft.

More generally, in aeronautic applications which make use of electrical energy storage units, an underlying discharge function of the respectively associated electrical energy sources covers the aspects of supplying sufficient electrical power to one or more given consumers, i.e., electrical loads, and to supply sufficient electrical energy, i.e., power over time, to the one or more given consumers. However, depending on a respective criticality of the consumer's operation and an intended or possible continuation of the consumer's operation, e.g., during a flight mission, discharge of the associated electrical energy sources, as a direct contributor to the consumer's operation, becomes critical as well. Therefore, in order to ensure the discharge function of the associated electrical energy sources, a suitable knowledge about its State-Of-Function (SOF, according to the document "Guidance on determination of accessible energy in battery systems for eVTOL applications" of the European Organization for Civil Aviation Equipment, i.e., EUROCAE ED-289) in each time step as well as of a remaining capability of the associated electrical energy sources, is essential.

For comparison only, in liquid or gaseous fuel tank systems which are e.g., supplying combustion engine applications in aircrafts, a currently available energy content can be measured and quantified through a single physical parameter measurement, e.g., a measured fuel volume, by means of float gauge sensing and/or displacement sensing. Thereby, a respectively measured fuel volume level set in relation to a full fuel volume level such as e.g., at the beginning of a given mission, enables determination of a remaining operating time, i.e., a remaining supply time of the combustion engine. However, in electrical energy storage units based on electro-chemical or electro-static energy storage principles, such as e.g., batteries and capacitors, a current state of charge (SOC) cannot directly been measured through a physical parameter due to multiple dependencies which may influence the energy that is or may be extracted from respective electrical energy sources of the electrical energy storage units.

By way of example, Lithium-ion battery applications which are required as power supply sources to implement the associated electrical energy sources for the high availability of electrical energy storage units in critical applications, such as e.g., when being used as propulsion batteries, emergency batteries, starter batteries, and so on, require a high availability and integrity of a respective current battery charge state. The battery charge state, i.e., the battery's SOC is, thereby, relevant to determine an actually remaining charge level and, thus, an actually remaining discharge time for supplying power to an associated critical application. Thus, the battery's SOC is information which is usually calculated within a respective battery system, e.g., a Battery Management System (BMS), through internal battery cell level data acquisition, in particular battery cell voltage, cell current and cell temperature sensing and signal processing. Thereby, a state of the art SOC algorithm applies e.g., Coulomb Counting and Prediction Models which are executed in real-time within an application software on a microcontroller or application firmware on a Field Programmable Gate Array (FPGA).

In order to ensure a sufficient remaining performance and endurance of a critical application of a given aircraft, which is powered by a given electrical energy storage unit, a SOC calculation function which is e.g., executed in the BMS of the given electrical energy storage unit, as well as an indication of respectively calculated SOC information inside an avionic display of the given aircraft, become safety critical information. More particularly, the SOC information needs to be determined by help of real-time calculation executed in an integrated logic. The real-time calculation itself, however, becomes a critical function as the data integrity and data availability becomes critical as soon as a respectively supplied load within the critical application is safety relevant, e.g., relevant for a continued safe flight mission of the given aircraft. Consequently, the SOC calculation function executed in software becomes as such together with required sensors for data acquisition and a subsequent data processing a certification critical item with functional design assurance level (FDAL), which can be rated up to the highest FDAL Level A for "loss of power generation margin information" or "erroneous power generation margin information", depending on an associated critical application of the given aircraft.

Nevertheless, the SOC information as a standalone indicator is not sufficient when assessing a current mission capability related with underlying limitations of the given electrical energy storage unit, as it is decoupled from major parameter limitations related with temperature or voltage of the given electrical energy storage unit. More specifically, respective temperature and voltage values of the given electrical energy storage unit are as such representing further limitations of the electrical energy storage unit, which may be flight mission limiting for the given aircraft. Therefore, electrical energy storage unit related parameters like SOC, voltage, and temperature are usually individually monitored and displayed independently from each other within the given aircraft's avionic system. However, the interaction between these parameters is not considered and, furthermore, an anticipation on a respectively remaining mission capability is not achieved.

SUMMARY

Based on the limitations and drawbacks of the prior art, it is an object of the present disclosure to provide a new method of safely and reliably determining a remaining energy storage capability of an electrical energy storage unit in an aircraft and, more particularly, of determining predictive remaining operating time information for the electrical energy storage unit. This object is solved by a method of determining a remaining operating time of an electrical energy storage unit in an aircraft.

More specifically, according to the present disclosure a method of determining a remaining operating time of an electrical energy storage unit in an aircraft comprises using a first sensor arrangement that is assembled with the electrical energy storage unit for measuring first performance parameters of the electrical energy storage unit, using a first computation unit that is assembled with the electrical energy storage unit for determining first performance indicators based on the first performance parameters, using at least one second sensor arrangement that is associated with the electrical energy storage unit for measuring second performance parameters of the electrical energy storage unit, using at least one second computation unit that is associated with the electrical energy storage unit for determining second performance indicators based on the second performance parameters, and using a vehicle management system (VMS) of the aircraft for comparing the first performance indicators with the second performance indicators to determine consolidated performance indicators, and for determining predictive remaining operating times of the electrical energy storage unit based on the consolidated performance indicators. The predictive remaining operating times comprise at least a predictive nominal remaining operating time and a predictive emergency remaining operating time.

More particularly, the present disclosure is related to a dissimilar and redundant remaining operating time calculation function for an electrical energy storage unit, wherein the remaining operating time calculation function is related to algorithms which are preferably executed within a high integer and high available avionic system of an aircraft. Furthermore, the present disclosure is related to an internal functional topology and logic parts of the electrical energy storage unit which are preferably communicating with an additional calculation function implemented by the VMS of the aircraft that, in turn, is implemented as part of the high integer and high available avionic system. The avionic system itself and, more particularly, the VMS may execute by nature of its criticality highest criticality FDAL Level A functions. By using algorithms which are shared within the logic part of the electrical energy storage unit, e.g., an associated main logic, and algorithms shared within an auxiliary logic, the VMS may enable predictive limitation calculations for the electrical energy storage unit. Respective predictions are as well critical as soon as a continued operation of the electrical energy storage unit is a critical function, which is the case if the electrical energy storage unit supplies, e.g., as a traction battery, critical consumers within an electrical propulsion system (EPS).

Advantageously, suitable performance data of the electrical energy storage unit is processed in a reliable and simple manner and respectively obtained limitation information is provided to and displayed on a display means in the aircraft, such as e.g., a first limit indicator (FLI) avionic display. Thereby, a safe and simple implementation of critical predictive functions related to the electrical energy storage unit is enabled. Moreover, an improved monitoring of basic parameters of the electrical energy storage unit is enabled, which ensures highest availability and integrity of respective limitations of the electrical energy storage unit. Furthermore, a calculation of extrapolated electrical energy storage unit related parameters is enabled, whereby a predictive operator/flight crew behavior are enabled and anticipation, planning and decision-making during a given flight mission is supported.

More specifically, data processing of the suitable performance data of the electrical energy storage unit is advantageously shared within three logical branches, i.e., a first branch formed by a main logic of the electrical energy storage unit, an auxiliary logic associated with the electrical energy storage unit, and a VMS implemented by an avionic system. With such a logical share together with the highest integer and reliable avionic system, i.e., the VMS which complies with FDAL Level A, a reduced FDAL Level C criticality on a suitable main logic design, e.g., complex hardware and software of the electrical energy storage unit, is enabled.

Furthermore, even though a suitable auxiliary logic design may be targeted with FDAL Level A, e.g., with one auxiliary logic channel, or even with a less demanding FDAL Level B, e.g., with two auxiliary logic channels, an underlying implementation of the auxiliary logic may be established using simple electronic hardware. Such simple electronic hardware has advantages in showing evidence for its safety and reliability, thus, significantly reducing certification efforts and costs. In particular, with the functional split of the proposed main and auxiliary logics, a suitable consolidation of critical data of the electrical energy storage unit, which is received from the main and auxiliary logics, is performed on the qualified avionic system, i.e., the VMS which complies with FDAL Level A. In summary, complex hardware and software parts, which are e.g., applied within the main logic of the electrical energy storage unit, and simple electronic hardware, which is e.g., applied within the auxiliary logic associated with the electrical energy storage unit, may be designed and justified with significantly lower effort.

According to some embodiments, the first performance parameters of the electrical energy storage unit comprise at least a first electric current, a first voltage and a first temperature of the electrical energy storage unit.

Accordingly, the first performance indicators may comprise at least a first electric current value derived from the first electric current, a first voltage value derived from the first voltage, and a first temperature value derived from the first temperature.

Similarly, the second performance parameters of the electrical energy storage unit may comprise at least a second electric current, a second voltage, and a second temperature of the electrical energy storage unit.

Accordingly, the second performance indicators may comprise at least a second current value derived from the second electric current, a second voltage value derived from the second voltage, and a second temperature value derived from the second temperature.

According to some embodiments, using the first sensor arrangement for measuring the first performance parameters of the electrical energy storage unit and using the at least one second sensor arrangement for measuring the second performance parameters of the electrical energy storage unit is performed simultaneously and repeatedly at predetermined time intervals. Thereby, the first performance indicators and the second performance indicators may be provided with respective time stamps.

According to some embodiments, comparing the first performance indicators with the second performance indicators to determine consolidated performance indicators comprises, for each one of the first performance indicators, determining whether a difference between the first performance indicator and an associated one of the second performance indicators lies within a predetermined performance tolerance. If the difference between the first performance indicator and an associated one of the second performance indicators lies inside of the predetermined performance tolerance, the first performance indicator is set as consolidated performance indicator. If the difference between the first performance indicator and an associated one of the second performance indicators lies outside of the predetermined performance tolerance, the first performance indicator and the associated one of the second performance indicators are invalidated.

According to some embodiments, the method of determining a remaining operating time of an electrical energy storage unit in an aircraft further comprises using the first computation unit for determining a first SOC value based on the first performance parameters, and using the VMS of the aircraft for determining a second SOC value based on the consolidated performance indicators.

Accordingly, comparing the first performance indicators with the second performance indicators to determine the consolidated performance indicators may comprise comparing the first SOC value with the second SOC value.

Comparing the first SOC value with the second SOC value may comprise determining whether a difference between the first SOC value and the second SOC value lies within a predetermined SOC tolerance. If the difference between the first SOC value and the second SOC value lies inside of the predetermined SOC tolerance, the first SOC value is set as consolidated SOC indicator. If the difference between the first SOC value and the second SOC value lies outside of the predetermined SOC tolerance, the first SOC value and the second SOC value are invalidated.

According to some embodiments, using the VMS of the aircraft for determining the predictive remaining operating times of the electrical energy storage unit based on the consolidated performance indicators comprises, for each one of the consolidated performance indicators, determining a first further developing of the consolidated performance indicator by extrapolating the consolidated performance indicator assuming a normal load case determined on the basis of an actual power request from the electrical energy storage unit, and determining a second further developing of the consolidated performance indicator by extrapolating the consolidated performance indicator assuming an emergency load case determined on the basis of a predefined emergency power request from the electrical energy storage unit.

According to some embodiments, using the VMS of the aircraft for determining the predictive remaining operating times of the electrical energy storage unit based on the consolidated performance indicators further comprises, for each one of the consolidated performance indicators, correlating the first further developing of the consolidated performance indicator with a predefined nominal limit of the consolidated performance indicator for determining the predictive nominal remaining operating time of the electrical energy storage unit, and correlating the second further developing of the consolidated performance indicator with a predefined emergency limit of the consolidated performance indicator for determining the predictive emergency remaining operating time of the electrical energy storage unit.

According to some embodiments, the method of determining a remaining operating time of an electrical energy storage unit in an aircraft further comprises using the VMS for generating display indications associated with the predictive nominal remaining operating time of the electrical energy storage unit and the predictive emergency remaining operating time of the electrical energy storage unit, and providing the display indications to a FLI of the aircraft for display.

According to some embodiments, the method of determining a remaining operating time of an electrical energy storage unit in an aircraft further comprises using the VMS for generating alerts associated with the predictive nominal remaining operating time of the electrical energy storage unit and the predictive emergency remaining operating time of the electrical energy storage unit.

Using the VMS for generating alerts associated with the predictive nominal remaining operating time of the electrical energy storage unit and the predictive emergency remaining operating time of the electrical energy storage unit may comprise using the consolidated performance indicators for generating the alerts.

BRIEF DESCRIPTION OF THE DRAWINGS

Preferred embodiments of the disclosure are outlined by way of example in the following description with reference to the attached drawings. In these attached drawings, identical or identically functioning components and elements are labeled with identical reference numbers and characters and are, consequently, only described once in the following description.

DETAILED DESCRIPTION

Figure 1:
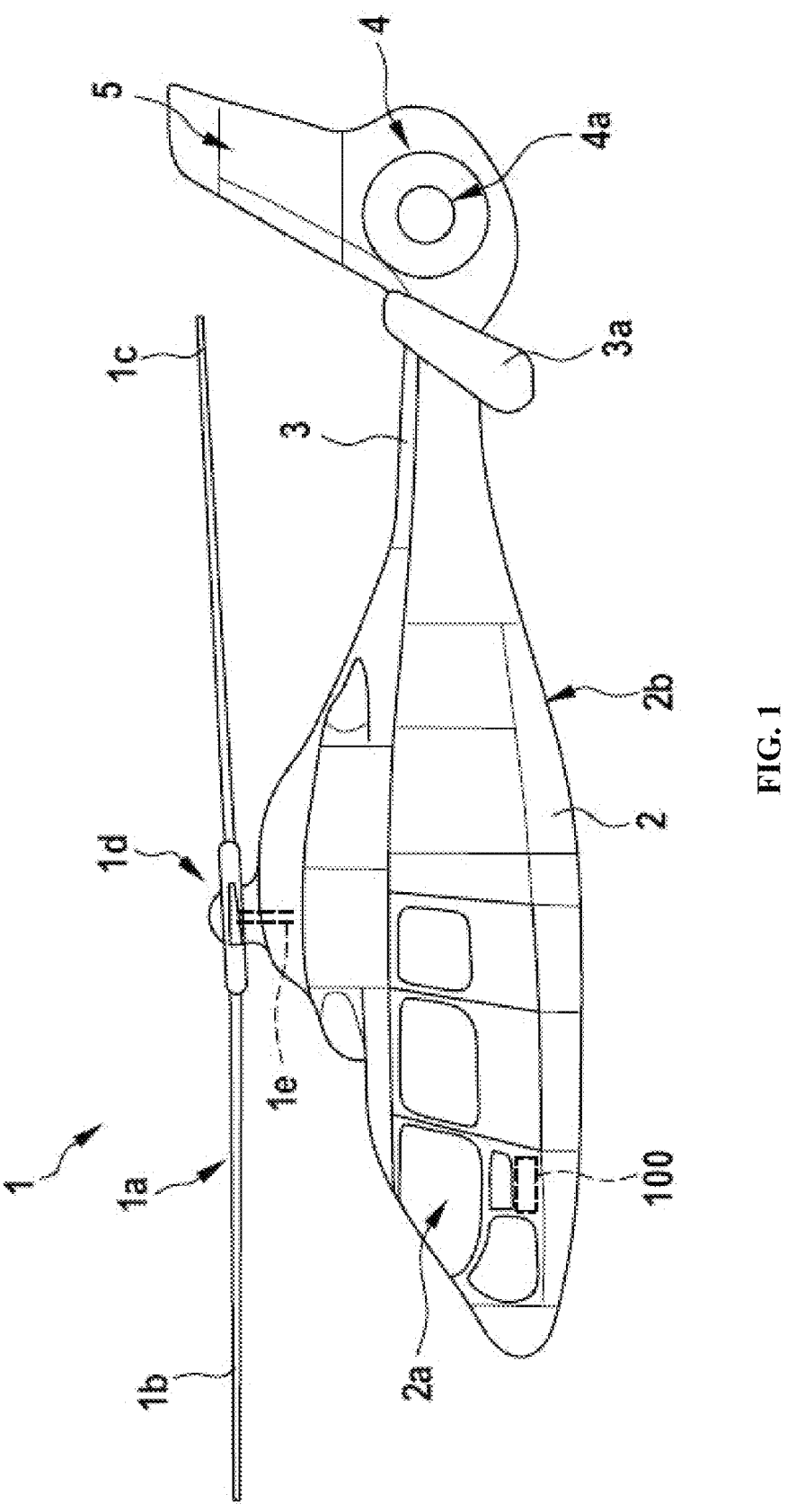
FIG. 1 shows a side view of an illustrative rotary wing aircraft in accordance with the present disclosure.

FIG. 1 shows an example of a transportation vehicle. A transportation vehicle may be a spacecraft, an aircraft, a car, a bus, a truck, or a train, just to name a few. In general, exemplary embodiments of the present disclosure may be included in any transportation vehicle.

As shown in FIG. 1, the transportation vehicle may be an aircraft 1 that is exemplarily illustrated as a rotary wing aircraft and, more particularly, as a helicopter. Thus, for purposes of simplicity and clarity, the rotary wing aircraft 1 is hereinafter referred to as the "helicopter" 1.

The helicopter 1 illustratively comprises at least one main rotor 1a, preferably a multi-blade rotor, for providing lift and forward or backward thrust during operation. By way of example, the at least one main rotor 1a comprises a plurality of rotor blades 1b, 1c that are mounted at an associated rotor head 1d to a rotor shaft 1e, which rotates in operation of the helicopter 1 around an associated rotor axis.

Illustratively, the helicopter 1 further comprises a fuselage 2 that forms an airframe of the helicopter 1. The fuselage 2 may be connected to a suitable landing gear and, by way of example, forms a cabin 2a and a rear fuselage 2b. The rear fuselage 2b may be connected to a tail boom 3.

Furthermore, the helicopter 1 may include at least one preferentially shrouded counter-torque device 4 configured to provide counter-torque during operation, i.e., to counter the torque created by rotation of the at least one main rotor 1a for purposes of balancing the helicopter 1 in terms of yaw. The at least one counter-torque device 4 is illustratively provided at an aft section of the tail boom 3 and may have a tail rotor 4a. The aft section of the tail boom 3 may include a fin 5. Illustratively, the tail boom 3 may be provided with a suitable horizontal stabilizer 3a.

Moreover, the helicopter 1 may include system applications with electrical systems that perform safety-critical operations, which are sometimes also referred to as mission-critical operations. Examples for safety-critical operations performed by electrical systems in the helicopter 1 may include controlling the helicopter's roll, pitch, yaw, and/or thrust.

Respective electrical systems are powered by one or more electrical energy storage units (e.g., electrical energy storage unit 150 in FIGS. 2A and 2B to FIGS. 4A and 4B, and FIGS. 10A and 10B). According to the present invention, a remaining operating time determination system 100 is provided and configured to enable determination of respective remaining operating times of the one or more electrical energy storage units, as described hereinafter.

Figure 2A:
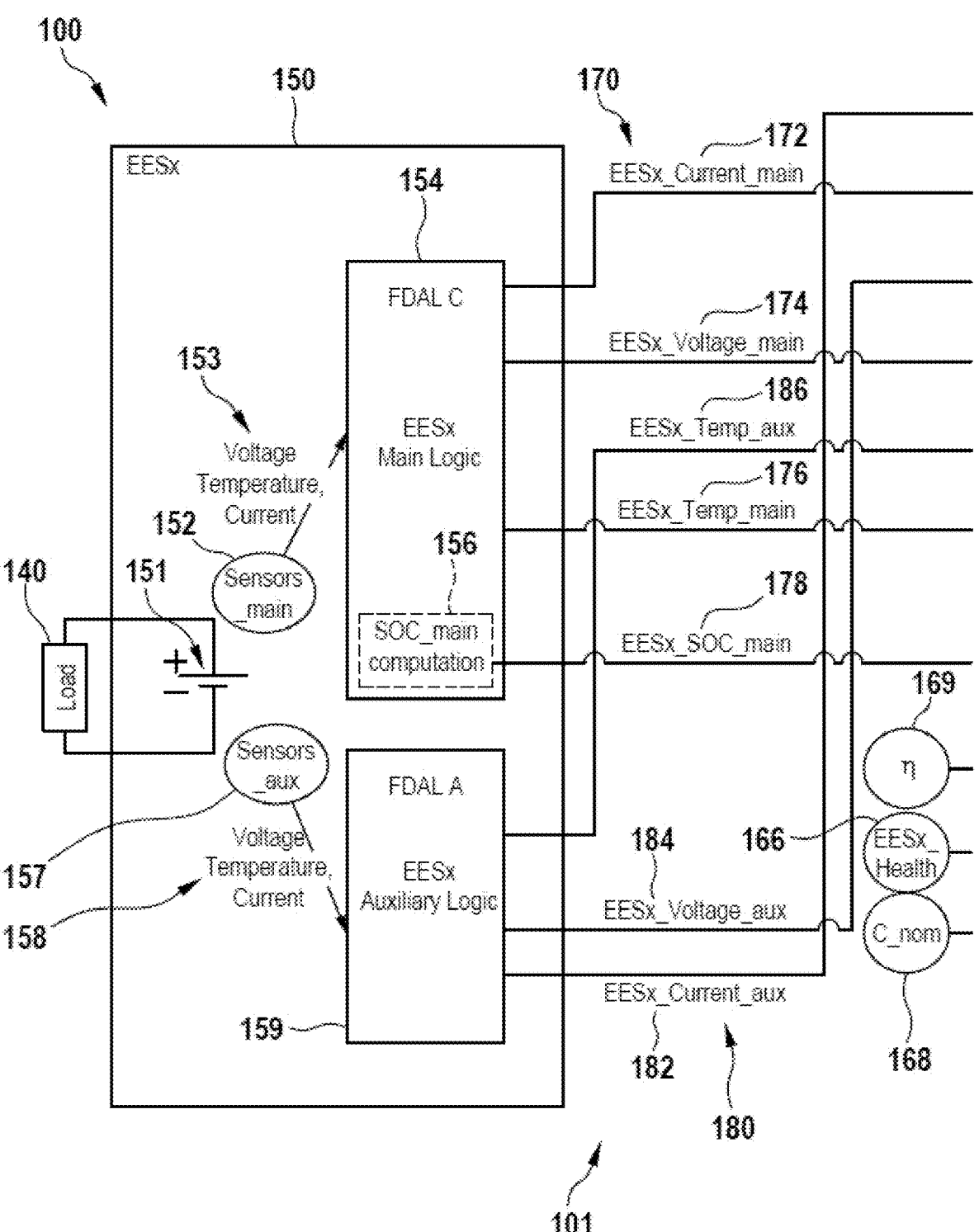
FIGS. 2A and 2B show functional diagrams of an illustrative remaining operating time determination system with an electrical energy storage unit comprising an internal sensor arrangement in accordance with the present invention.
Figure 2B:
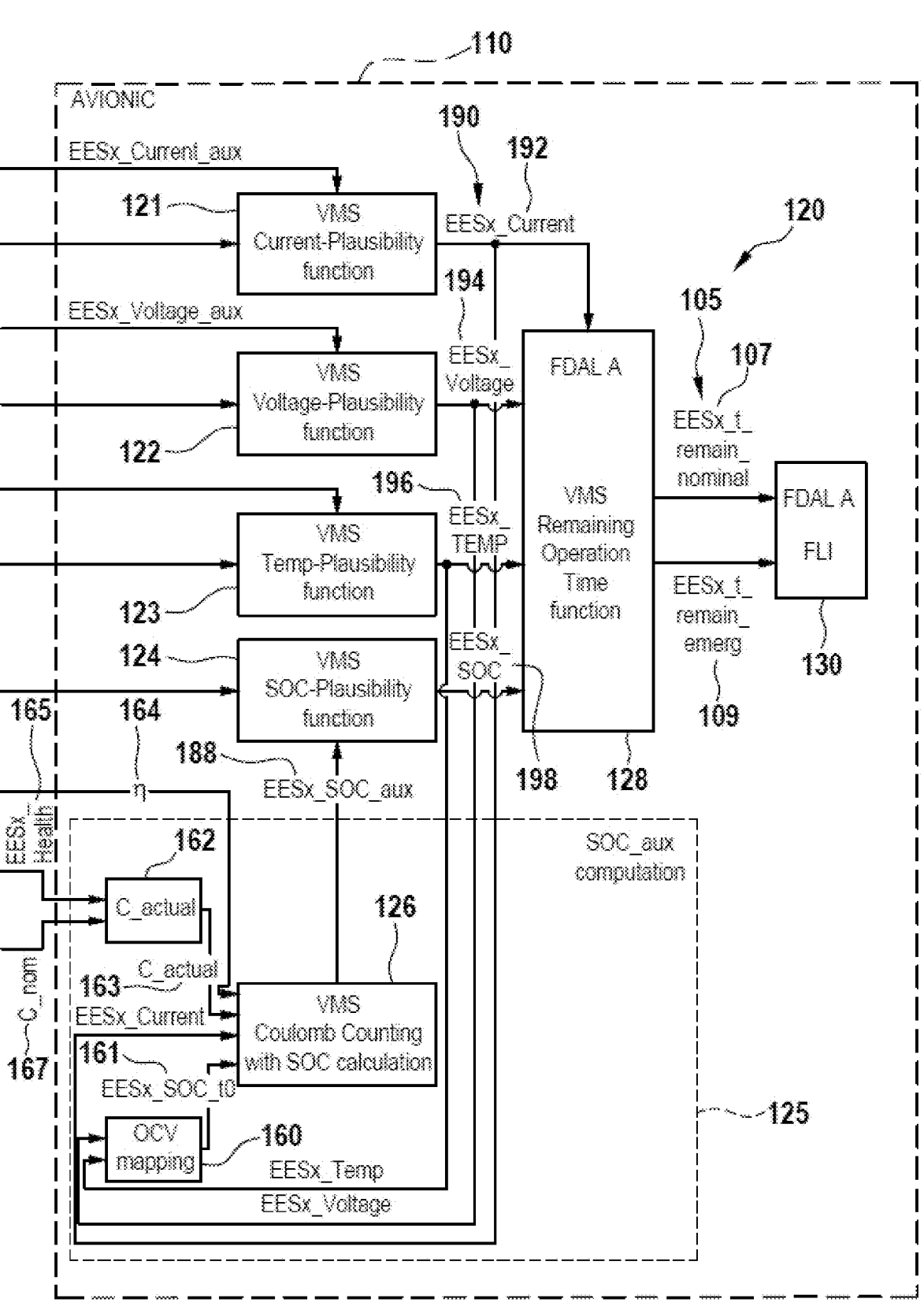

FIGS. 2A and 2B shows an embodiment of the remaining operating time determination system 100 of FIG. 1, which illustratively comprises an electrical energy storage unit 150 and components of an avionic system 110 of the helicopter 1 of FIG. 1. According to the present invention, the remaining operating time determination system 100 is configured for performing a method 101 of determining a remaining operating time of the electrical energy storage unit 150, as described below.

Preferably, the electrical energy storage unit 150 is provided to supply electrical energy to an electrical load 140 in the helicopter 1 of FIG. 1. The electrical load 140 may be any electrical component that transforms electrical energy into some other form of energy, which may include electrical energy, thermal energy, mechanical energy, electromagnetic energy, sound energy, chemical energy, or a combination thereof. For example, the electrical load 140 may include an electric motor that transforms electrical energy into mechanical energy, sound, and heat. As another example, the electrical load 140 may include a light bulb that transforms electrical energy into light and heat. Preferably, the electrical load 140 supplies a critical application that performs a safety-critical operation with electrical energy. As an example, such a safety-critical operation may include controlling the pitch and/or thrust of the at least one main rotor 1a of the helicopter 1 of FIG. 1.

Illustratively, the electrical energy of the electrical energy storage unit 150 is provided by an electrical energy source 151. The electrical energy source 151 may be any device able to provide electricity to the electrical load 140. For instance, the electrical energy source 151 may be a lithium-ion rechargeable battery, a nickel cadmium rechargeable battery, a lithium-ion polymer rechargeable battery, a nickel metal hydride battery, or any other rechargeable or non-rechargeable battery.

At this point, it should be noted that only a single electrical energy storage unit, i.e., the electrical energy storage unit 150, is shown in FIGS. 2A and 2B. However, the remaining operating time determination system 100 and, more generally, the helicopter 1 of FIG. 1, may also be provided with more than one electrical energy storage units. In other words, the remaining operating time determination system 100 may generally be provided with a number of x≥1 electrical energy storage units. Therefore, the electrical energy storage unit 150 is generally referred to below as the "EESx 150", for simplicity and clarity. The EESx 150 is representatively described in more detail hereinafter.

The EESx 150 comprises a first sensor arrangement 152 that is assembled with the EESx 150 and used for measuring first performance parameters 153 of the EESx 150. Illustratively, the first sensor arrangement 152 forms a main sensor arrangement and is, therefore, also referred to as the "main sensor arrangement 152" hereinafter. The first performance parameters 153 preferably comprise at least a first electric current, a first voltage and a first temperature of the EESx 150 and, more particularly, of the electrical energy source 151.

The first performance parameters 153 are transmitted to a first computation unit 154 that is assembled with the EESx 150. The first computation unit 154 forms a main computation unit, i.e., a main logic, and is, therefore, also referred to as the "main logic 154" hereinafter. Preferably, the main logic 154 complies with the FDAL Level C.

The main logic 154 is used for determining first performance indicators 170 based on the first performance parameters 153. The first performance indicators 170 are hereinafter also referred to as the "main performance indicators 170", for simplicity and clarity, and preferably comprise at least a first electric current value 172 derived from the first electric current, a first voltage value 174 derived from the first voltage, and a first temperature value 176 derived from the first temperature.

Illustratively, the first electric current value 172 is referred to as "EESx_Current_main", the first voltage value 174 is referred to as "EESx_Voltage_main", and the first temperature value 176 is referred to as "EESx_Temp_main". The electric current value 172 EESx_Current_main, the voltage value 174 EESx_Voltage_main, and the temperature value 176 EESx_Temp_main are transmitted from the main logic 154 to the avionic system 110.

In addition, the main logic 154 is preferably used for determining, based on the first performance parameters 153, a first SOC value 178 that is illustratively referred to as "EESx_SOC_main" and considered as being also part of the main performance indicators 170. Therefore, the main logic 154 may implement a suitable SOC_main computation function 156 for determining the SOC value 178 EESx_SOC_main. The SOC value 178 EESx_SOC_main is also transmitted from the main logic 154 to the avionic system 110.

Furthermore, the EESx 150 comprises a second sensor arrangement 157 that is associated with the EESx 150 and used for measuring second performance parameters 158 of the EESx 150. As illustrated, the second sensor arrangement 157 may be assembled with the EESx 150. Preferably, using the second sensor arrangement 157 for measuring the second performance parameters 158 of the EESx 150 and using the main sensor arrangement 152 for measuring the first performance parameters 153 of the EESx 150 is performed simultaneously and repeatedly at predetermined time intervals (e.g., 612, 614 in FIG. 6).

Illustratively, the second sensor arrangement 157 forms an auxiliary sensor arrangement and is, therefore, also referred to as the "auxiliary sensor arrangement 157" hereinafter. The second performance parameters 158 preferably comprise at least a second electric current, a second voltage and a second temperature of the EESx 150 and, more particularly, of the electrical energy source 151.

The second performance parameters 157 are transmitted to a second computation unit 159 that is associated, and illustratively assembled, with the EESx 150. The second computation unit 159 forms an auxiliary computation unit, i.e., an auxiliary logic, and is, therefore, also referred to as the "auxiliary logic 159" hereinafter. Preferably, the auxiliary logic 159 complies with the FDAL Level A.

The auxiliary logic 159 is used for determining second performance indicators 180 based on the second performance parameters 158. The second performance indicators 180 are hereinafter also referred to as the "auxiliary performance indicators 180", for simplicity and clarity, and preferably comprise at least a second electric current value 182 derived from the second electric current, a second voltage value 184 derived from the second voltage, and a second temperature value 186 derived from the second temperature.

Illustratively, the second electric current value 182 is referred to as "EESx_Current_aux", the second voltage value 184 is referred to as "EESx_Voltage_aux", and the second temperature value 186 is referred to as "EESx_Temp_aux". The electric current value 182 EESx_Current_aux, the voltage value 184 EESx_Voltage_aux, and the temperature value 186 EESx_Temp_aux are transmitted from the auxiliary logic 159 to the avionic system 110.

The avionic system 110 comprises a VMS 120 that illustratively implements at least a VMS current plausibility function 121, a VMS voltage plausibility function 122, a VMS temperature plausibility function 123, a VMS SOC plausibility function 124, a VMS SOC computation unit 125, and a VMS remaining operating time function 128. The VMS 120 receives the electric current value 172 EESx_Current_main, the voltage value 174 EESx_Voltage_main, the temperature value 176 EESx_Temp_main, and the SOC value 178 EESx_SOC_main, as well as the electric current value 182 EESx_Current_aux, the voltage value 184 EESx_Voltage_aux, and the temperature value 186 EESx_Temp_aux. In other words, the VMS 120 receives the main performance indicators 170 and the auxiliary performance indicators 180.

The VMS 120 is used for comparing the main performance indicators 170 with the auxiliary performance indicators 180 to determine consolidated performance indicators 190. The main performance indicators 170 and the auxiliary performance indicators 180 are preferably provided with respective time stamps ($t_0$, $t_1$, $t_2$, etc.).

As described in more detail below, comparing the main performance indicators 170 with the auxiliary performance indicators 180 to determine the consolidated performance indicators 190 preferably comprises, for each one of the main performance indicators 170, determining whether a difference between the respective main performance indicator and an associated one of the auxiliary performance indicators lies within a predetermined performance tolerance. If the difference lies inside of the predetermined performance tolerance, the respective main performance indicator is set as a consolidated performance indicator. If, however, the difference lies outside of the predetermined performance tolerance, the respective main performance indicator and the associated one of the auxiliary performance indicators are invalidated.

More specifically, the VMS current plausibility function 121 preferably receives the electric current value 172 EESx_Current_main and the electric current value 182 EESx_Current_aux and compares both values with each other to determine a consolidated electric current indicator 192 that is illustratively referred to as "EESx_Current". By way of example, the VMS current plausibility function 121 may implement the following comparing logic:

```
IF{
(EESx_Current_main − EESx_Current_aux) < curr_tol_plus AND
(EESx_Current_main − EESx_Current_aux) > curr_tol_minus
    EESx_Current = EESx_Current_main; }
ELSE{
    EESx_Current = 'INVALID';}
```

Similarly, the VMS voltage plausibility function 122 preferably receives the voltage value 174 EESx_Voltage_main and the voltage value 184 EESx_Voltage_aux and compares both values with each other to determine a consolidated voltage indicator 194 that is illustratively referred to as "EESx_Voltage". By way of example, the VMS voltage plausibility function 122 may implement the following comparing logic:

```
IF{
(EESx_Voltage_main − EESx_Voltage_aux) < volt_tol_plus
AND
(EESx_Voltage_main − EESx_Voltage_aux) > volt_tol_minus
    EESx_Voltage = EESx_Voltage_main; }
ELSE{
    EESx_Voltage = 'INVALID';}
```

Similarly, the VMS temperature plausibility function 123 preferably receives the temperature value 176 EESx_Temp_main and the temperature value 186 EESx_Temp_aux and compares both values with each other to determine a consolidated temperature indicator 196 that is illustratively referred to as "EESx_Temp". By way of example, the VMS temperature plausibility function 123 may implement the following comparing logic:

```
IF{
(EESx_Temp_main − EESx_Temp_aux) < temp_tol_plus
AND
(EESx_Temp_main − EESx_Temp_aux) > temp_tol_minus
    EESx_Temp = EESx_Temp_main; }
ELSE{
    EESx_Temp = 'INVALID';}
```

Similarly, the VMS SOC plausibility function 124 preferably receives the SOC value 178 EESx_SOC_main and a SOC value 188 that is illustratively referred to as "EESx_SOC_aux". The SOC value 188 EESx_SOC_aux may be determined by the VMS SOC computation unit 125 which, therefore, preferably comprises a VMS SOC calculator 126 that is configured for ensuring an SOC real-time calculation independent of the SOC_main computation function 156 that is implemented by the main logic 154 of the EESx 150. Illustratively, the VMS SOC computation unit 125 further comprises an Open Circuit Voltage (OCV) mapping 160 and a remaining energy source capacity determination function 162.

More specifically, the OCV mapping 160 preferably receives the consolidated voltage indicator 194 EESx_Voltage from the VMS voltage plausibility function 122 and the consolidated temperature indicator 196 EESx_Temp from the VMS temperature plausibility function 123. By means of the OCV mapping 160 an initial SOC value 161 "EESx_SOC_$t_0$" for the point in time t=0, i.e., prior to start of a respective operation of the EESx 150, such as charging or discharging, may be determined based on the OCV (e.g., EESx_Voltage mapped to EESx_SOC_$t_0$). Thereby, the OCV is preferably specifically characterized and verified related to the used cell type and chemistry of the electrical energy source 151 of the EESx 150 in advance by help of standard cell measurements.

Furthermore, the remaining energy source capacity determination function 162 determines a resulting useful or remaining energy source capacity value 163 "C_actual" based on a predetermined health value 165 "EESx_Health" and a nominal capacity value 167 "C_nom". The predetermined health value 165 EESx_Health may e.g., be obtained from an associated health values table 166.

More specifically, the predetermined health value 165 EESx_Health is preferably set as a static, i.e., constant value that is e.g., initialized once within the VMS 120 prior to the operation of the EESx 150, i.e., prior to charging or discharging. For instance, the predetermined health value 165 EESx_Health may result from a robust and reliable laboratory-based reference cycle measurement of the EESx 150, i.e., a reference full charge and full discharge cycle, which determines the useful capacity, and a resistance measurement that determines an internal resistance increase of the EESx 150. The reference cycle measurement may follow representative charge and discharge conditions related with the electric load 140.

Alternatively, the predetermined health value 165 EESx_Health may be obtained as a real-time parameter from an independent State-Of-Health (SOH) computation system associated with the EESx 150, e.g., based on suitable impedance measurements of the EESx 150. However, implementation of such an independent SOH computation system requires high integrity in order to ensure a suitable accuracy of the SOC value 188 EESx_SOC_aux.

In any case, the predetermined health value 165 EESx_Health may be considered as a derating parameter which calibrates based on the nominal capacity value 167 C_nom the remaining energy source capacity value 163 C_actual as a function depending amongst others on aging. Therein, the nominal capacity value 167 C_nom may be considered as a begin-of-life capacity value that may e.g., be retrieved from a suitable nominal capacity values table 168.

Similarly, the constant coulomb efficiency q, which is illustratively labelled with the reference sign 164, may be retrieved from a suitable coulomb efficiencies table 169. More specifically, the coulombic efficiencies q, which are dependent on an underlying battery or energy storage cell technology of the energy source 151, may be initialized as constant values. These values may be set differently depending on the mathematical current sign. More particularly, when considering positive currents flowing from the electrical energy source 151, i.e., discharge currents, the coulombic efficiency n may be set to >99%, e.g., for lithium-ion battery cells, whereas when considering negative currents flowing to the electrical energy source 151, i.e., charging currents, the coulombic efficiency $\eta$ may be set to <99%, e.g., due to losses which are not contributing to the chemical reactions and, thus, are not contributing to SOC increase.

The constant coulomb efficiency 164 $\eta$, the remaining energy source capacity value 163 C_actual, the initial SOC value 161 EESx_SOC_$t_0$, as well as the consolidated electric current indicator 192 EESx_Current are then used by the VMS SOC calculator 126 which preferably implements a Coulomb counting functional block and determines the SOC value 188 EESx_SOC_aux as a function of time as follows:

$$EESx\_SOC\_aux(t) = EESx\_SOC\_t_0 - \frac{1}{C\_actual} \int_{t_0}^{t} \eta EESx\_Current(t)dt$$

Thus, the SOC value 188 EESx_SOC_aux is determined as a part of the auxiliary performance indicators 180 by the VMS 120 based on the consolidated performance indicators 192, 194, 196, and the VMS SOC plausibility function 124 may compare the SOC value 178 EESx_SOC_main and the SOC value 188 EESx_SOC_aux with each other to determine a consolidated SOC indicator 198 that is illustratively referred to as "EESx_SOC". By way of example, the VMS SOC plausibility function 124 may implement the following comparing logic:

```
IF{
(EESx_SOC_main − EESx_SOC_aux) < soc_tol_plus
AND
(EESx_SOC_main − EESx_SOC_aux) > soc_tol_minus
    EESx_SOC = EESx_SOC_main; }
ELSE{
    EESx_SOC = 'INVALID';}
```

In other words, the VMS SOC plausibility function 124 determines whether a difference between the SOC value 178 EESx_SOC_main and the SOC value 188 EESx_SOC_aux lies within a predetermined SOC tolerance. If so, the SOC value 178 EESx_SOC_main is set as the consolidated SOC indicator 198 EESx_SOC. Otherwise, the SOC value 178 EESx_SOC_main and the SOC value 188 EESx_SOC_aux are invalidated.

The consolidated SOC indicator 198 EESx_SOC, as well as the consolidated electric current indicator 192 EESx_Current, the consolidated voltage indicator 194 EESx_Voltage, and the consolidated temperature indicator 196 EESx_Temp, i.e., the consolidated performance indicators 190, are transmitted to the VMS remaining operating time function 128, which preferably complies with the FDAL Level A. The VMS remaining operating time function 128 and, more generally, the VMS 120 is then used for determining predictive remaining operating times 105 of the EESx 150 based on the consolidated performance indicators 190, as described below at FIG. 5 to FIG. 8. The predictive remaining operating times 105 preferably comprise at least a predictive nominal remaining operating time 107 that is illustratively referred to as "EESx_t_remain_nominal", and a predictive emergency remaining operating time 109 that is illustratively referred to as "EESx_t_remain_emerg".

If desired, the VMS 120 may generate display indications associated with the predictive nominal remaining operating time 107 EESx_t_remain_nominal and the predictive emergency remaining operating time 109 EESx_t_remain_emerg for a FLI 130 of the avionic system 110. By way of example, depending on an underlying criticality and requirements e.g., for operation of an EPS connected to the EESx 150, the VMS 120 and, more particularly, an associated computation unit or logic of the FLI 130 may define a display indication "FLI_EESx_remaining_time" as follows:

```
IF{
EESx_t_remain_nominal(z) < EESx_t_remain_emerg(z)
    FLI_EESx_remaining_time(z) = EESx_t_remain_nominal(z); }
ELSE{
    FLI_EESx_remaining_time(z) = EESx_t_remain_emerg(z);}
```

Therein, "z" is an integer with z $\geq$ 0 which defines a sampling step representing a point in time associated with determination of the predictive nominal remaining operating time 107 EESx_t_remain_nominal and the predictive emergency remaining operating time 109 "EESx_t_remain_emerg". The FLI 130 may then display the display indication FLI_EESx_remaining_time to a respective flight crew or an operator. Preferably, the FLI 130 complies with the FDAL Level A.

Figure 3:
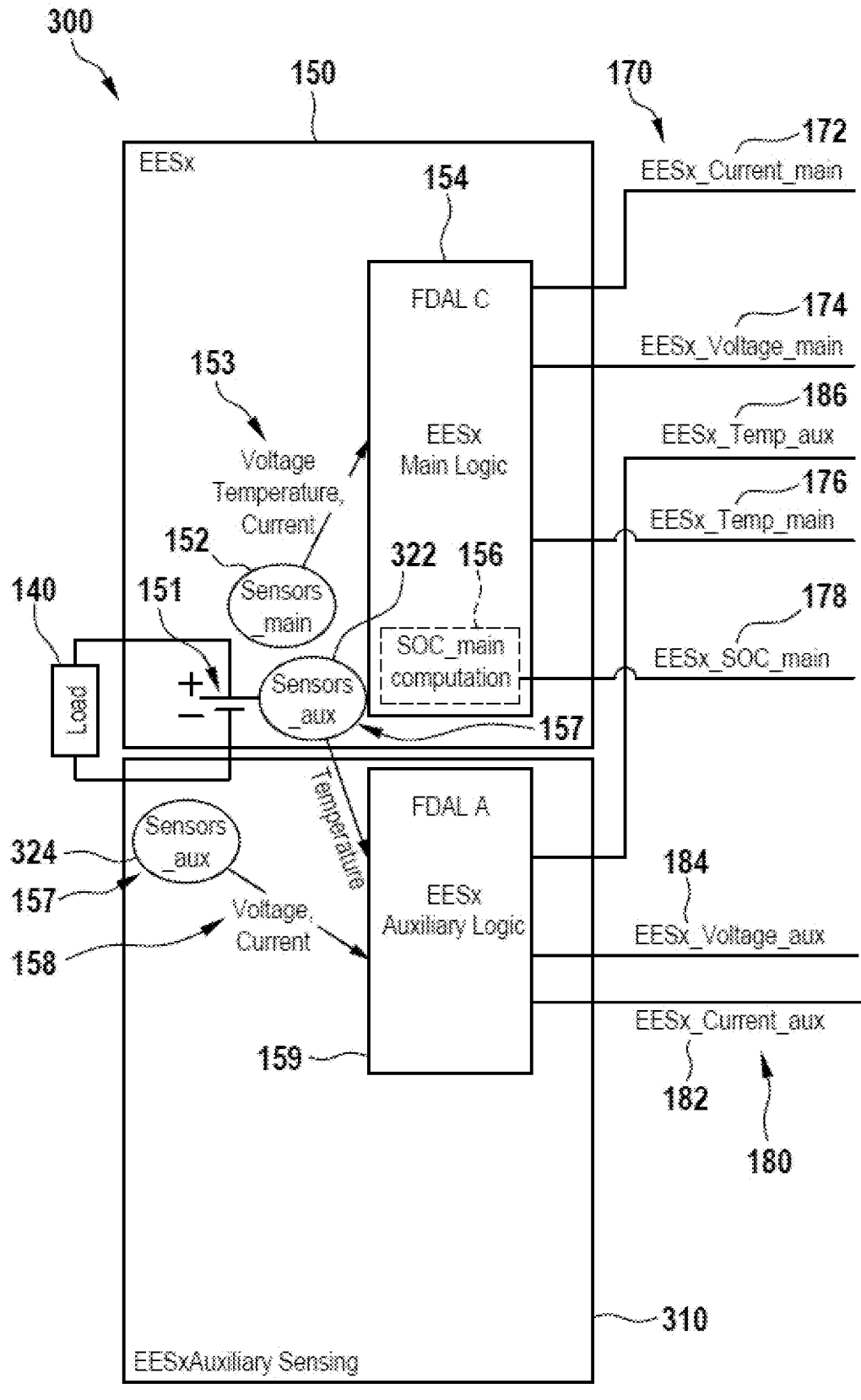
FIG. 3 shows a functional diagram of an illustrative variant of the electrical energy storage unit of FIGS. 2A and 2B with an external sensor arrangement.

FIG. 3 shows an arrangement 300 with the electrical load 140 and the EESx 150 of FIGS. 2A and 2B. According to FIGS. 2A and 2B, the EESx 150 comprises the electrical energy source 151, the main sensor arrangement 152 that is assembled with the EESx 150 and used for measuring the first performance parameters 153, and the main logic 154 that is used for determining the main performance indicators 170, i.e., the electric current value 172 EESx_Current_main, the voltage value 174 EESx_Voltage_main, and the temperature value 176 EESx_Temp_main, based on the first performance parameters 153. The main logic 154 also implements the SOC_main computation function 156 that is used for determining the SOC value 178 EESx_SOC_main. Furthermore, the auxiliary sensor arrangement 157 is associated with the EESx 150 and used for measuring the second performance parameters 158.

However, in contrast to FIGS. 2A and 2B now at least a part of the auxiliary sensor arrangement 157 that is used for measuring the second performance parameters 158 is assembled with an external sensor arrangement 310. By way of example, a temperature sensor 322 of the auxiliary sensor arrangement 157 is assembled with the EESx 150, whereas suitable voltage/current sensors 324 of the auxiliary sensor arrangement 157 are assembled with the external sensor arrangement 310.

Furthermore, also in contrast to FIGS. 2A and 2B, the auxiliary logic 159 is now assembled with the external sensor arrangement 310. Nevertheless, as described above at FIGS. 2A and 2B, the auxiliary logic 159 is still used for determining the auxiliary performance indicators 180, i.e., the electric current value 182 EESx_Current_aux, the voltage value 184 EESx_Voltage_aux, and the temperature value 186 EESx_Temp_aux, based on the second performance parameters 158.

Figure 4A:
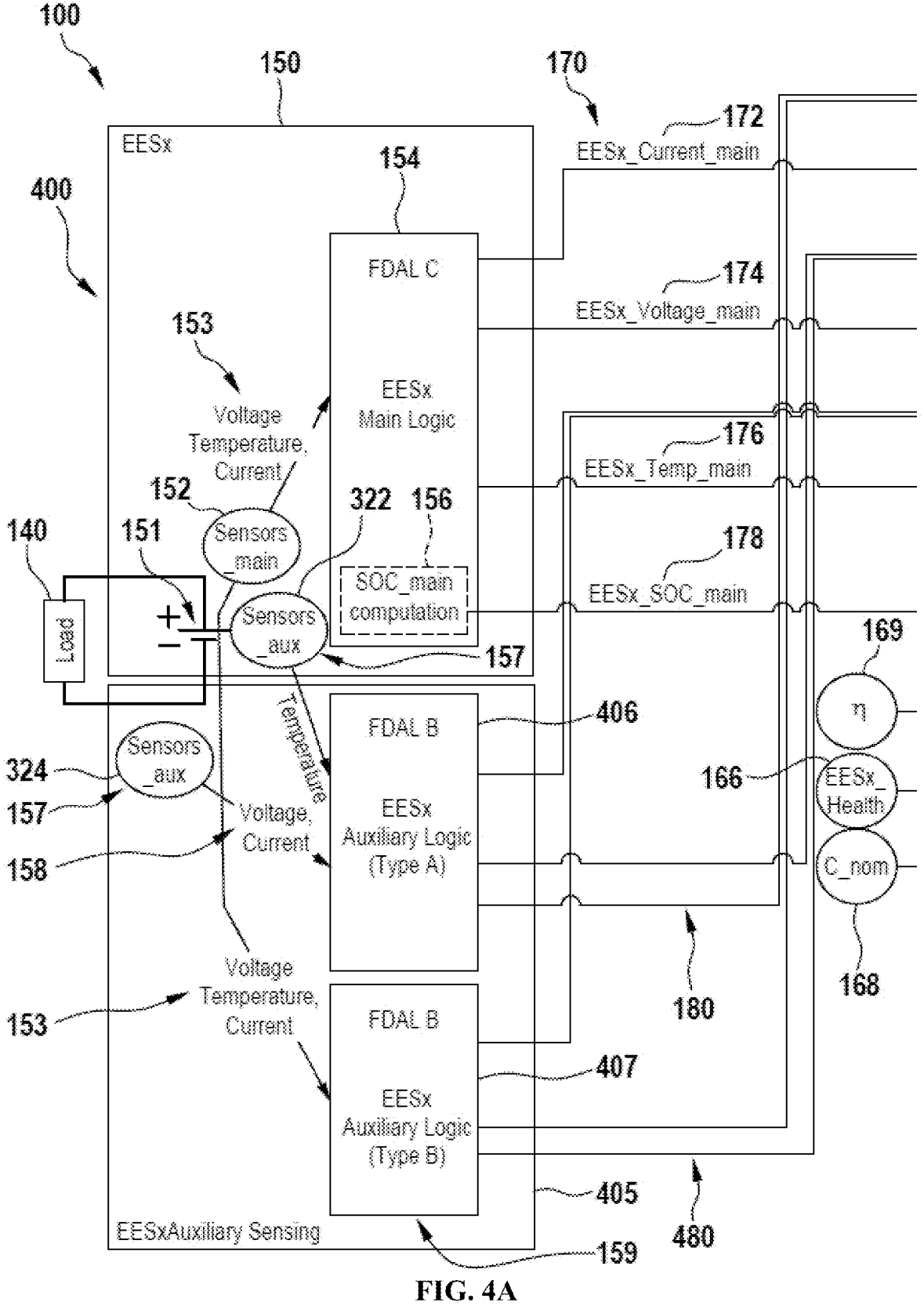
FIGS. 4A and 4B show functional diagrams of the remaining operating time determination system of FIGS. 2A and 2B with an electrical energy storage unit comprising an external sensor arrangement and with an alerting function in accordance with the present disclosure.
Figure 4B:
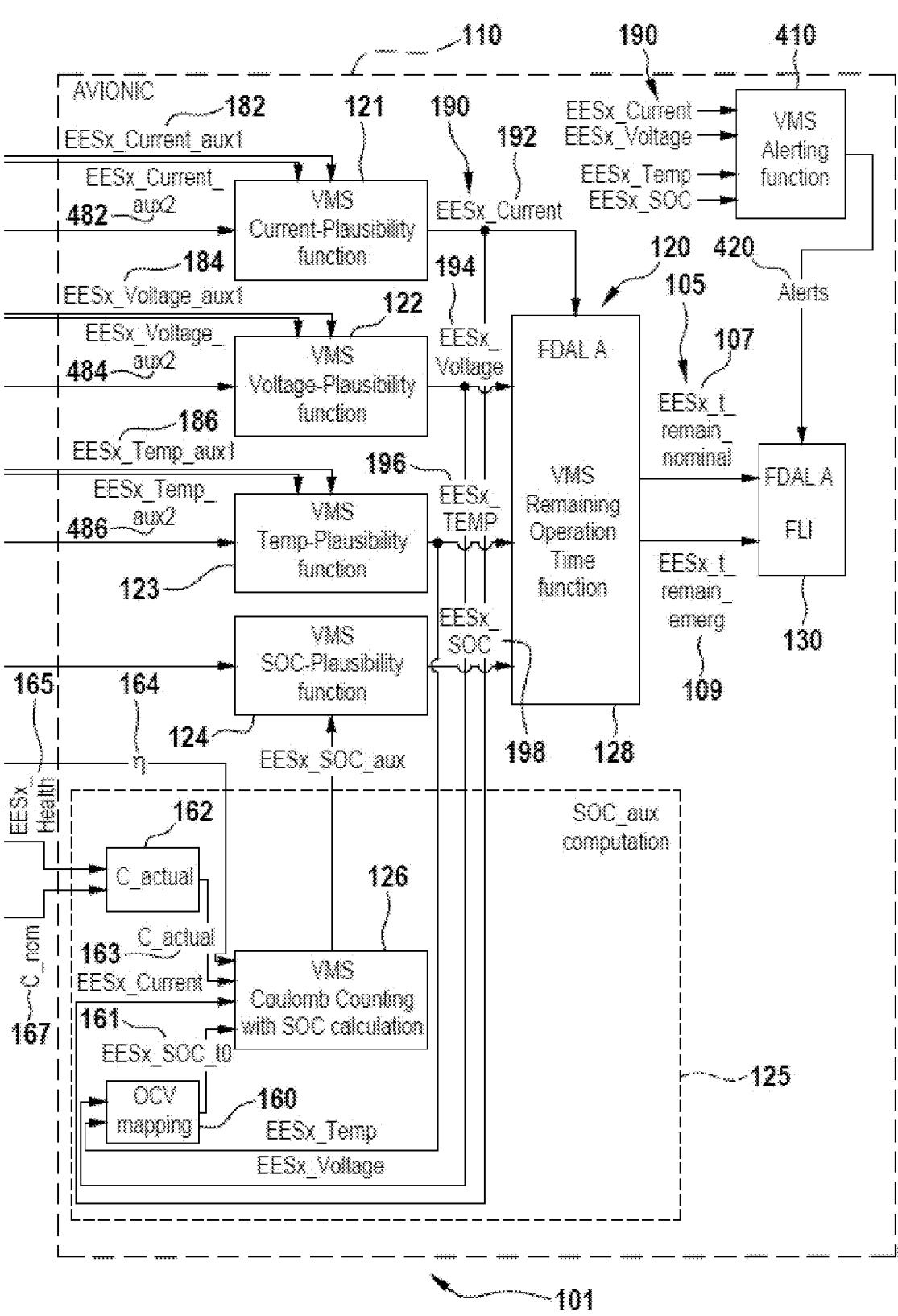

FIGS. 4A and 4B shows the remaining operating time determination system 100 of FIGS. 2A and 2B with an arrangement 400 that comprises the electrical load 140 and the EESx 150 of FIGS. 2A and 2B, as well as with the components of the avionic system 110 which comprise according to FIGS. 2A and 2B the FLI 130 and the VMS 120 that implements besides others the VMS current plausibility function 121, the VMS voltage plausibility function 122, the VMS temperature plausibility function 123, the VMS SOC plausibility function 124, and the VMS remaining operating time function 128. More specifically, the remaining operating time determination system 100 is configured according to FIGS. 2A and 2B for performing the method 101 of determining a remaining operating time of the EESx 150, which preferably comprises determining the predictive remaining operating times 105, i.e., the predictive nominal remaining operating time 107 EESx_t_remain_nominal and the predictive emergency remaining operating time 109 EESx_t_remain_emerg.

More particularly, according to FIGS. 2A and 2B the EESx 150 comprises the electrical energy source 151, the main sensor arrangement 152 that is assembled with the EESx 150 and used for measuring the first performance parameters 153, and the main logic 154 that is used for determining the main performance indicators 170, i.e., the electric current value 172 EESx_Current_main, the voltage value 174 EESx_Voltage_main, and the temperature value 176 EESx_Temp_main, based on the first performance parameters 153. The main logic 154 also implements the SOC_main computation function 156 that is used for determining the SOC value 178 EESx_SOC_main. Furthermore, the auxiliary sensor arrangement 157 is associated with the EESx 150 and used for measuring the second performance parameters 158.

However, in contrast to FIGS. 2A and 2B now at least a part of the auxiliary sensor arrangement 157 that is used for measuring the second performance parameters 158 is assembled with an external sensor arrangement 405. More specifically, according to FIG. 3 the temperature sensor 322 of the auxiliary sensor arrangement 157 is assembled with the EESx 150, whereas the voltage/current sensors 324 of the auxiliary sensor arrangement 157 are assembled with the external sensor arrangement 405.

Furthermore, also in contrast to FIGS. 2A and 2B, the auxiliary logic 159 is now assembled with the external sensor arrangement 405 and split into a first auxiliary logic 406 and a second auxiliary logic 407. The first auxiliary logic 406 illustratively takes over the function of the auxiliary logic 159 as described at FIGS. 2A and 2B, i.e., the first auxiliary logic 406 is used for determining the auxiliary performance indicators 180, i.e., the electric current value 182 which is now referred to as "EESx_Current_aux1", the voltage value 184 which is now referred to as "EESx_Voltage_aux1", and the temperature value 186 which is now referred to as "EESx_Temp_aux1", based on the second performance parameters 158. The second auxiliary logic 407, in turn, is preferably used for determining additional auxiliary performance indicators 480, i.e., an additional electric current value 482 which is referred to as "EESx_Current_aux2", an additional voltage value 484 which is referred to as "EESx_Voltage_aux2", and an additional temperature value 486 which is referred to as "EESx_Temp_aux2". Advantageously, by using two independent auxiliary logics, i.e., the first auxiliary logic 406 and the second auxiliary logic 407, for determining the auxiliary performance indicators 180 and the additional auxiliary performance indicators 480, it is sufficient if both auxiliary logics 406, 407 respectively only comply with the FDAL Level B.

The additional auxiliary performance indicators 480 are received at the VMS 120 and processed together with the auxiliary performance indicators 180, similar to what is described at FIGS. 2A and 2B. Thus, the consolidated performance indicators 190, i.e., the consolidated electric current indicator 192 EESx_Current, the consolidated voltage indicator 194 EESx_Voltage, the consolidated temperature indicator 196 EESx_Temp, and the consolidated SOC indicator 198 EESx_SOC are obtained.

The consolidated performance indicators 190 are used by the VMS remaining operating time function 128 of the VMS 120 for determining the predictive remaining operating times 105, as described above at FIGS. 2A and 2B. In addition, the consolidated performance indicators 190 may be used by the VMS 120 for generating alerts 420 which are, preferably, associated with the predictive nominal remaining operating time 107 EESx_t_remain_nominal and/or the predictive emergency remaining operating time 109 EESx_t_remain_emerg.

More specifically, the VMS 120 may implement a VMS alerting function 410 that receives the consolidated performance indicators 190, i.e., the consolidated electric current indicator 192 EESx_Current, the consolidated voltage indicator 194 EESx_Voltage, the consolidated temperature indicator 196 EESx_Temp, and the consolidated SOC indicator 198 EESx_SOC. The VMS alerting function 410 may e.g., check the validity of the consolidated performance indicators 190 and, furthermore, compare the consolidated performance indicators 190 with associated limit values for generating the alerts 420, as described in more detail at FIG. 9 below.

Figure 5:
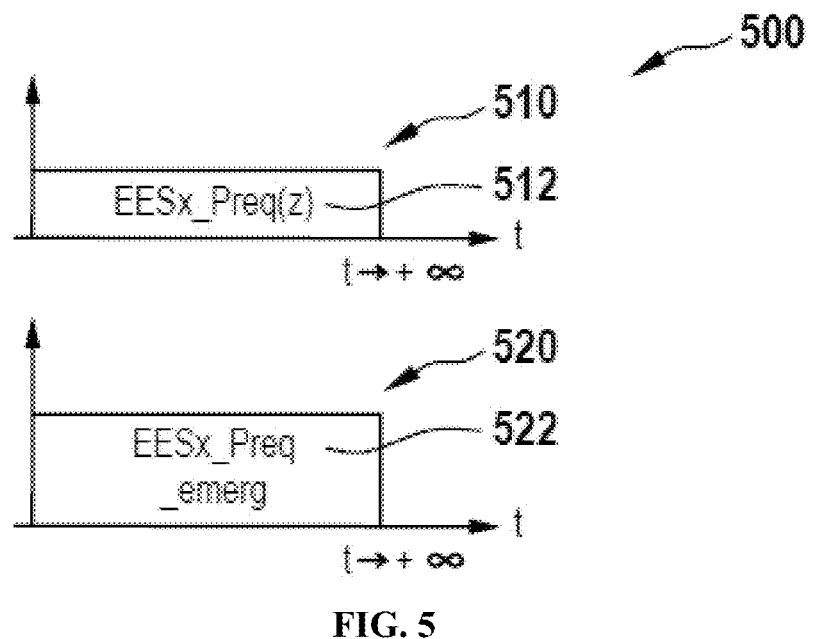
FIG. 5 shows function graphs of illustrative load scenarios.

FIG. 5 shows illustrative load extrapolating scenarios 500 for the EESx 150 of FIG. 2A to FIG. 4B, which may be used for extrapolating suitable EESx parameter limitations. For simplicity, however, only two illustrative load extrapolating scenarios 510 and 520 are shown and described in more detail.

The first illustrative load extrapolating scenario 510 is related to a normal load case, in which it is assumed that a currently consumed power, i.e., an actual power request 512 "EESx_Preq(z)", may be requested from the EESx 150 of FIG. 2A to FIG. 4B at each sampling step z, wherein z is an integer with z≥0. Therefore, the actual power request 512 EESx_Preq(z) may be considered as a constant power value over time t throughout a given discharge interval [z; ∞[and used for extrapolation purposes, as described below at FIG. 6 to FIG. 8. In addition, determination of the actual power request 512 EESx_Preq(z) may comprise considering planned or predefined power intervals for nominal mission completion, e.g., considering during nominal landing a descent flight power, hover in ground power, contingency power reserves, and so on.

More generally, the planned or predefined power intervals may be related to complementary mission segments which may be predefined, e.g., mission or flight path was planned upfront by a pilot, or which may be predicted or calculated, e.g., based on weather data, flight altitude, operator flight history, and so on, using standard VMS algorithms or using future artificial intelligence. By way of example, the actual power request 512 EESx_Preq(z) may be computed in each sampling step z as:

$$EESx\_Preq(z) = EESx\_Current(z) * EESx\_Voltage(z)$$

The second illustrative load extrapolating scenario 520 is related to an emergency load case in which it is assumed that a currently consumed power corresponds to a predefined emergency power request 522 "EESx_Preq_emerg" which may be requested from the EESx 150 of FIG. 2A to FIG. 4B as a constant power value over time t throughout a given discharge interval [z; ∞[and used for extrapolation purposes, as described below at FIG. 6 to FIG. 8. In addition, determination of the predefined emergency power request 522 "EESx_Preq_emerg" may comprise considering planned or predefined power intervals for emergency mission completion, e.g., considering during emergency landing a descent flight power, hover in ground power, contingency power reserves, and so on. An emergency load case may e.g., occur in a so-called One Engine Inoperative (OEI) failure scenario.

At this point, it should be noted that further extrapolation scenarios may be considered. For instance, such further extrapolation scenarios may include various different power profiles (e.g., power demands versus time).

Figure 6:
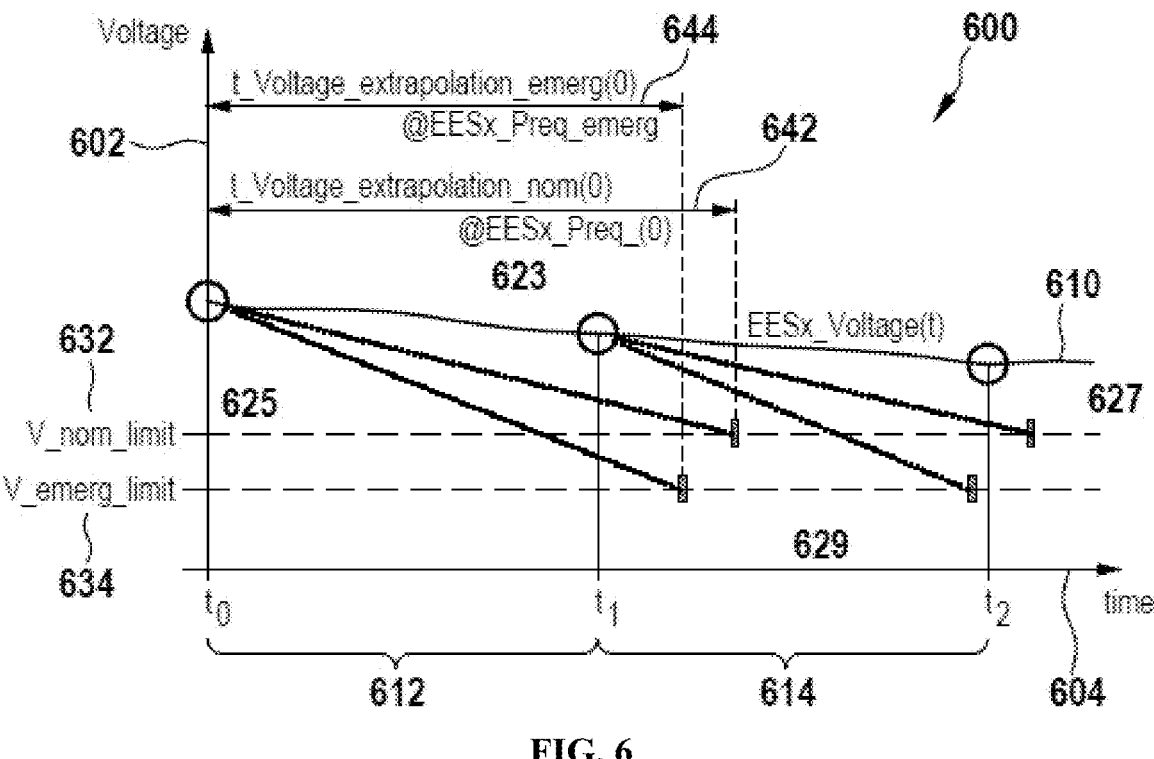
FIG. 6 to FIG. 8 show function graphs of illustrative consolidated parameters for the electrical energy storage unit of FIGS. 2A and 2B and FIGS. 4A and 4B.

FIG. 6 shows an illustrative consolidated voltage diagram 600 having an ordinate 602 representing voltage values, and an abscissa 604 representing time values. By way of example, the consolidated voltage diagram 600 is shown with a consolidated voltage indicators curve 610 that illustrates development of the consolidated voltage indicator 194 EESx_Voltage of FIGS. 2A and 2B and FIGS. 4A and 4B over time, i.e., in the form of a curve representing a consolidated voltage indicator over time "EESx_Voltage(t)". Furthermore, two time intervals 612, 614 are indicated. Illustratively, the first time interval 612 is spanned between a point in time to and a point in time $t_1$, and the second time interval 614 is spanned between the point in time $t_1$ and a point in time $t_2$.

More generally, the consolidated voltage indicator EESx_Voltage(t) is based on an actually measured parameter and is a relevant attribute for ensuring a required performance of the electrical load 140 of FIGS. 2A and 2B and FIGS. 4A and 4B, which may e.g., be a constant power consumer such as an electric motor which is requiring a given minimum input voltage in order to guarantee a safe and reliable operation. The consolidated voltage indicator EESx_Voltage(t) is furthermore an indication for an actual depth of discharge and reflects indirectly a current charge level of the EESx 150 of FIG. 2A to FIG. 4B, as voltage values are e.g., relevant for SOC computation and, thus, relevant for predicting the remaining operating times 105 of the EESx 150 of FIG. 2A to FIG. 4B.

More specifically, predicting the remaining operating times 105 of the EESx 150 of FIG. 2A to FIG. 4B may use for each sampling step z, i.e., at each one of the points in time $t=t_0$, $t_1$, $t_2$, and so on, the consolidated voltage indicator EESx_Voltage(t). By means of a suitable extrapolation algorithm the consolidated voltage indicator EESx_Voltage(t) is extrapolated at each new sampling step z, i.e., at each one of the points in time $t=t_0$, $t_1$, $t_2$, and so on, assuming that a given load scenario is kept constant throughout a respectively considered subsequent discharge interval [t; ∞[using, for instance, associated predefined extrapolation scenarios, e.g., the scenarios 510, 520 of FIG. 5 with the power requests EESx_Preq(t) and EESx_Preq_emerg. In case the extrapolated consolidated voltage indicator EESx_Voltage(t) is exceeding a predefined constant limit threshold defined for the normal load case or for the emergency load case, the duration from the current sampling step z to a point in time when the constant limit threshold is exceeded can be determined and, thus, be used as a predicted time limit. In other words, a first time limit until reaching of a predefined constant limit threshold defined for the normal load case may be determined, and a second time limit until reaching of a predefined constant limit threshold defined for the emergency load case may be determined. In any case, the predefined constant limit thresholds may be set in order to ensure a continued and safe EPS performance until a respective end of a previewed operating time of the EESx 150 of FIG. 2A to FIG. 4B under all nominal and emergency situations.

More specifically, in the illustrated example for determining the predictive remaining operating times 105 of the EESx 150 of FIG. 2B to FIG. 4B based on the consolidated voltage indicator EESx_Voltage(t), a first further developing and a second further developing of the consolidated voltage indicator EESx_Voltage(t) is determined at each sampling step z, i.e., at each one of the points in time $t=t_0$, $t_1$, $t_2$, and so on, for instance, by extrapolating the consolidated performance indicator EESx_Voltage(t) assuming a normal load case and an emergency load case. Respective normal and emergency load case scenarios are described above at FIG. 5.

Each first further developing is then correlated with a predefined nominal voltage limit 632 "V_nom_limit" of the consolidated voltage indicator EESx_Voltage(t) for determining a predictive nominal remaining operating time 642 "t_Voltage_extrapolation_nom(t)" of the EESx 150 of FIG. 2A to FIG. 4B. Likewise, each second further developing is correlated with a predefined emergency voltage limit 634 "V_emerg_limit" of the consolidated voltage indicator EESx_Voltage(t) for determining a predictive emergency remaining operating time 644 "t_Voltage_extrapolation_emerg(t)" of the EESx 150 of FIG. 2A to FIG. 4B.

Illustratively, further developing curves 623 and 627 which assume a normal load case are extrapolated at the points in time $t_0$, $t_1$. Likewise, further developing curves 625 and 629 which assume an emergency load case are extrapolated at the points in time to, $t_1$.

Furthermore, at the point in time to the further developing 623 is correlated with the predefined nominal voltage limit 632 V_nom_limit of the consolidated voltage indicator EESx_Voltage(t) for determining the predictive nominal remaining operating time 642 t_Voltage_extrapolation_nom $(t_0)$ starting at the point in time to. Likewise, the further developing 625 is correlated with the predefined emergency voltage limit 634 V_emerg_limit of the consolidated voltage indicator EESx_Voltage(t) for determining the predictive emergency remaining operating time 644 t_Voltage_extrapolation_emerg$(t_0)$ starting at the point in time to.

Then, at the point in time $t_1$ the further developing 627 is correlated with the predefined nominal voltage limit 632 V_nom_limit of the consolidated voltage indicator EESx_Voltage(t) for determining the predictive nominal remaining operating time t_Voltage_extrapolation_nom$(t_1)$ starting at the point in time $t_1$, which is, however, not illustrated for simplicity and clarity of the drawing. Likewise, the further developing 629 is correlated with the predefined emergency voltage limit 634 V_emerg_limit of the consolidated voltage indicator EESx_Voltage(t) for determining the predictive emergency remaining operating time t_Voltage_extrapolation_emerg$(t_1)$ starting at the point in time $t_1$, which is, however, also not illustrated for simplicity and clarity of the drawing.

The above extrapolations are then repeated at the point in time $t_2$, and so on. Thus, at each sampling step z, i.e., at each one of the points in time to, $t_1$, $t_2$, and so on, an associated predictive nominal remaining operating time t_Voltage_extrapolation_nom and an associated predictive emergency remaining operating time t_Voltage_extrapolation_emerg are determined.

Figure 7:
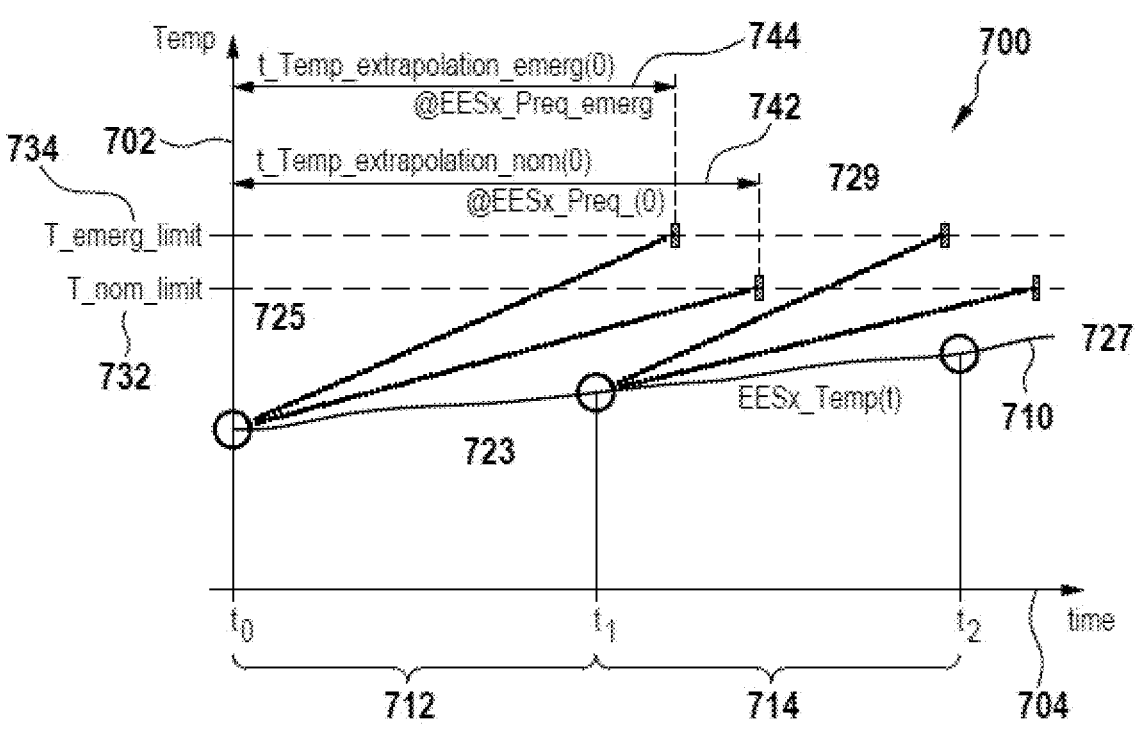

FIG. 7 shows an illustrative consolidated temperature diagram 700 having an ordinate 702 representing temperature values, and an abscissa 704 representing time values.

By way of example, the consolidated temperature diagram 700 is shown with a consolidated temperature indicators curve 710 that illustrates development of the consolidated temperature indicator 196 EESx_Temp of FIGS. 2A and 2B and FIGS. 4A and 4B over time, i.e., in the form of a curve representing a consolidated temperature indicator over time "EESx_Temp(t)". Furthermore, two time intervals 712, 714 are indicated. Illustratively, the first time interval 712 is spanned between a point in time to and a point in time $t_1$, and the second time interval 714 is spanned between the point in time $t_1$ and a point in time $t_2$.

More generally, the consolidated temperature indicator EESx_Temp(t) is based on an actually measured parameter and is a relevant attribute for ensuring a required performance of the EESx 150 of FIGS. 2A and 2B and FIGS. 4A and 4B in order to guarantee a safe and reliable operation of the EESx 150. In fact, too low or too high temperatures of the EESx 150 may cause performance limitations of the EESx 150 and even prevent a continued energy supply to the electrical load 140 of FIGS. 2A and 2B and FIGS. 4A and 4B, which may e.g., be a constant power consumer such as an electric motor which is requiring a continued energy supply.

With respect to the consolidated temperature indicator EESx_Temp(t), predicting the remaining operating times 105 of the EESx 150 of FIG. 2A to FIG. 4B may use for each sampling step z, i.e., at each one of the points in time $t=t_0$, $t_1$, $t_2$, and so on, the consolidated temperature indicator EESx_Temp(t). By means of a suitable extrapolation algorithm the consolidated temperature indicator EESx_Temp(t) is extrapolated at each new sampling step z, i.e., at each one of the points in time $t=t_0$, $t_1$, $t_2$, and so on, assuming that a given load scenario is kept constant throughout a respectively considered subsequent discharge interval [t; ∞[using, for instance, associated predefined extrapolation scenarios, e.g., the scenarios 510, 520 of FIG. 5 with the power requests EESx_Preq(t) and EESx_Preq_emerg. In case the extrapolated consolidated temperature indicator EESx_Temp(t) is exceeding a predefined constant limit threshold defined for the normal load case or for the emergency load case, the duration from the current sampling step z to a point in time when the constant limit threshold is exceeded can be determined and, thus, be used as a predicted time limit. In other words, a first time limit until reaching of a predefined constant limit threshold defined for the normal load case may be determined, and a second time limit until reaching of a predefined constant limit threshold defined for the emergency load case may be determined. In any case, the predefined constant limit thresholds may be set in order to ensure a continued and safe EPS performance until a respective end of a previewed operating time of the EESx 150 of FIG. 2A to FIG. 4B under all nominal and emergency situations.

More specifically, in the illustrated example for determining the predictive remaining operating times 105 of the EESx 150 of FIG. 2A to FIG. 4B based on the consolidated temperature indicator EESx_Temp(t), a first further developing and a second further developing of the consolidated temperature indicator EESx_Temp(t) is determined at each sampling step z, i.e., at each one of the points in time $t=t_0$, $t_1$, $t_2$, and so on, for instance, by extrapolating the consolidated temperature indicator EESx_Temp(t) assuming a normal load case and an emergency load case. Respective normal and emergency load case scenarios are described above at FIG. 5.

Each first further developing is then correlated with a predefined nominal temperature limit 732 "T_nom_limit" of the consolidated temperature indicator EESx_Temp(t) for determining a predictive nominal remaining operating time 742 "t_Temp_extrapolation_nom(t)" of the EESx 150 of FIG. 2A to FIG. 4B. Likewise, each second further developing is correlated with a predefined emergency temperature limit 734 "T_emerg_limit" of the consolidated temperature indicator EESx_Temp(t) for determining a predictive emergency remaining operating time 744 "t_Temp_extrapolation_emerg(t)" of the EESx 150 of FIG. 2A to FIG. 4B.

Illustratively, further developing curves 723 and 727 which assume a normal load case are extrapolated at the points in time $t_0$, $t_1$. Likewise, further developing curves 725 and 729 which assume an emergency load case are extrapolated at the points in time to, $t_1$.

Furthermore, at the point in time to the further developing 723 is correlated with the predefined nominal temperature limit 732 T_nom_limit of the consolidated temperature indicator EESx_Temp(t) for determining the predictive nominal remaining operating time 742 t_Temp_extrapolation_nom($t_0$) starting at the point in time to. Likewise, the further developing 725 is correlated with the predefined emergency temperature limit 734 T_emerg_limit of the consolidated temperature indicator EESx_Temp(t) for determining the predictive emergency remaining operating time 744 t_Temp_extrapolation_emerg($t_0$) starting at the point in time to.

Then, at the point in time $t_1$ the further developing 727 is correlated with the predefined nominal temperature limit 732 T_nom_limit of the consolidated temperature indicator EESx_Temp(t) for determining the predictive nominal remaining operating time t_Temp_extrapolation_nom($t_1$) starting at the point in time $t_1$, which is, however, not illustrated for simplicity and clarity of the drawing. Likewise, the further developing 729 is correlated with the predefined emergency temperature limit 734 T_emerg_limit of the consolidated temperature indicator EESx_Temp(t) for determining the predictive emergency remaining operating time t_Temp_extrapolation_emerg($t_1$) starting at the point in time $t_1$, which is, however, also not illustrated for simplicity and clarity of the drawing.

The above extrapolations are then repeated at the point in time $t_2$, and so on. Thus, at each sampling step z, i.e., at each one of the points in time to, $t_1$, $t_2$, and so on, an associated predictive nominal remaining operating time t_Temp_extrapolation_nom and an associated predictive emergency remaining operating time t_Temp_extrapolation_emerg are determined.

Figure 8:
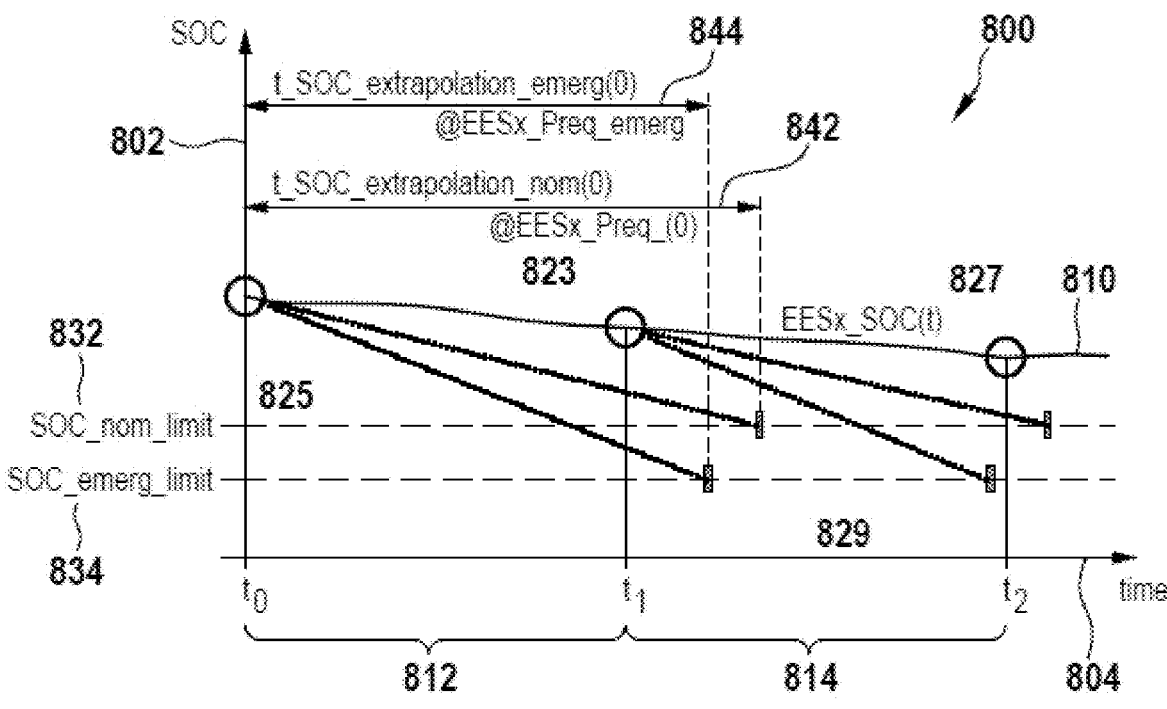

FIG. 8 shows an illustrative consolidated SOC diagram 800 having an ordinate 802 representing SOC values, and an abscissa 804 representing time values. By way of example, the consolidated SOC diagram 800 is shown with a consolidated SOC indicators curve 810 that illustrates development of the consolidated SOC indicator 198 EESx_SOC of FIGS. 2A and 2B and FIGS. 4A and 4B over time, i.e., in the form of a curve representing a consolidated SOC indicator over time "EESx_SOC(t)". Furthermore, two time intervals 812, 814 are indicated. Illustratively, the first time interval 812 is spanned between a point in time to and a point in time $t_1$, and the second time interval 814 is spanned between the point in time $t_1$ and a point in time $t_2$.

At this point, it should be noted that the consolidated electric current indicator 192 EESx_Current of FIGS. 2A and 2B and FIGS. 4A and 4B over time is based on an actually measured parameter and is a relevant attribute for determining an actual power request from the electrical load 140 of FIGS. 2A and 2B and FIGS. 4A and 4B, which may e.g., be a constant power consumer such as an electric motor which is requiring a given minimum input power in order to guarantee a safe and reliable operation. The consolidated electric current indicator 192 EESx_Current of FIGS. 2A and 2B and FIGS. 4A and 4B over time is relevant for computing the consolidated SOC indicator over time EESx_SOC(t).

The consolidated SOC indicator EESx_SOC(t), in turn, is a relevant attribute e.g., for ensuring energy provisions for a planned flight range/mission capability of the helicopter 1 of FIG. 1 including a respective landing flight segment, energy reserves ensuring contingencies for failure/emergency cases, energy reserves for unplanned flight extensions/go-around, and so on. Thus, the consolidated SOC indicator EESx_SOC(t) may also be used for determining the predictive remaining operating times 105 of the EESx 150 of FIG. 2A to FIG. 4B.

With respect to the consolidated SOC indicator EESx_SOC(t), predicting the remaining operating times 105 of the EESx 150 of FIG. 2A to FIG. 4B may use for each sampling step z, i.e., at each one of the points in time $t=t_0$, $t_1$, $t_2$, and so on, the consolidated SOC indicator EESx_SOC(t). By means of a suitable extrapolation algorithm the consolidated SOC indicator EESx_SOC(t) is extrapolated at each new sampling step z, i.e., at each one of the points in time $t=t_0$, $t_1$, $t_2$, and so on, assuming that a given load scenario is kept constant throughout a respectively considered subsequent discharge interval [t; ∞[using, for instance, associated predefined extrapolation scenarios, e.g., the scenarios 510, 520 of FIG. 5 with the power requests EESx_Preq(t) and EESx_Preq_emerg. In case the extrapolated consolidated SOC indicator EESx_SOC(t) is exceeding a predefined constant limit threshold defined for the normal load case or for the emergency load case, the duration from the current sampling step z to a point in time when the constant limit threshold is exceeded can be determined and, thus, be used as a predicted time limit.

In other words, a first time limit until reaching of a predefined constant limit threshold defined for the normal load case may be determined, and a second time limit until reaching of a predefined constant limit threshold defined for the emergency load case may be determined. In any case, the predefined constant limit thresholds may be set in order to ensure a continued and safe EPS performance until a respective end of a previewed operating time of the EESx 150 of FIG. 2A to FIG. 4B under all nominal and emergency situations.

More specifically, in the illustrated example for determining the predictive remaining operating times 105 of the EESx 150 of FIG. 2A to FIG. 4B based on the consolidated SOC indicator EESx_SOC(t), a first further developing and a second further developing of the consolidated SOC indicator EESx_SOC(t) is determined at each sampling step z, i.e., at each one of the points in time $t=t_0$, $t_1$, $t_2$, and so on, for instance, by extrapolating the consolidated SOC indicator EESx_SOC(t) assuming a normal load case and an emergency load case. Respective normal and emergency load case scenarios are described above at FIG. 5.

Each first further developing is then correlated with a predefined nominal SOC limit 832 "SOC_nom_limit" of the consolidated SOC indicator EESx_SOC(t) for determining a predictive nominal remaining operating time 842 "t_SOC_extrapolation_nom(t)" of the EESx 150 of FIG. 2A to FIG. 4B. Likewise, each second further developing is correlated with a predefined emergency SOC limit 834 "SOC_emerg_limit" of the consolidated SOC indicator EESx_SOC(t) for determining a predictive emergency remaining operating time 844 "t_SOC_extrapolation_emerg(t)" of the EESx 150 of FIG. 2A to FIG. 4B.

Illustratively, further developing curves 823 and 827 which assume a normal load case are extrapolated at the points in time $t_0$, $t_1$. Likewise, further developing curves 825 and 829 which assume an emergency load case are extrapolated at the points in time to, $t_1$.

Furthermore, at the point in time to the further developing 823 is correlated with the predefined nominal SOC limit 832 SOC_nom_limit of the consolidated SOC indicator EESx_SOC(t) for determining the predictive nominal remaining operating time 842 t_SOC_extrapolation_nom ($t_0$) starting at the point in time to. Likewise, the further developing 825 is correlated with the predefined emergency SOC limit 834 SOC_emerg_limit of the consolidated SOC indicator EESx_SOC(t) for determining the predictive emergency remaining operating time 844 t_SOC_extrapolation_emerg($t_0$) starting at the point in time to.

Then, at the point in time $t_1$ the further developing 827 is correlated with the predefined nominal SOC limit 832 SOC_nom_limit of the consolidated SOC indicator EESx_SOC(t) for determining the predictive nominal remaining operating time t_SOC_extrapolation_nom($t_1$) starting at the point in time $t_1$, which is, however, not illustrated for simplicity and clarity of the drawing. Likewise, the further developing 829 is correlated with the predefined emergency SOC limit 834 SOC_emerg_limit of the consolidated SOC indicator EESx_SOC(t) for determining the predictive emergency remaining operating time t_SOC_extrapolation_emerg($t_1$) starting at the point in time $t_1$, which is, however, also not illustrated for simplicity and clarity of the drawing.

The above extrapolations are then repeated at the point in time $t_2$, and so on. Thus, at each sampling step, i.e., at each one of the points in time to, $t_1$, $t_2$, and so on, an associated predictive nominal remaining operating time t_SOC_extrapolation_nom and an associated predictive emergency remaining operating time t_SOC_extrapolation_emerg are determined.

At his point, it should be noted that the predictive nominal remaining operating time t_SOC_extrapolation_nom and the associated predictive emergency remaining operating time t_SOC_extrapolation_emerg may be used by the VMS remaining operating time function 128 of FIGS. 2A and 2B and FIGS. 4A and 4B together with the predictive nominal remaining operating times t_Voltage_extrapolation_nom, t_Temp_extrapolation_nom, and the associated predictive emergency remaining operating times t_Voltage_extrapolation_emerg, t_Temp_extrapolation_emerg according to FIG. 6 and FIG. 7 for determining the predictive nominal remaining operating time 107 EESx_t_remain_nominal and the predictive emergency remaining operating time 109 EESx_t_remain_emerg of FIGS. 2A and 2B and FIGS. 4A and 4B. More specifically, the VMS remaining operating time function 128 of FIGS. 2A and 2B and FIGS. 4A and 4B may compare the predictive nominal remaining operating times t_Voltage_extrapolation_nom, t_Temp_extrapolation_nom, and t_SOC_extrapolation_nom with each other to determine the predictive nominal remaining operating time 107 EESx_t_remain_nominal as follows:

EESx_t remain_nominal(z) = minimum[
t_Voltage_extrapolation_nom(z),
t_Temp_extrapolation_nom(z),
t_SOC_extrapolation_nom(z) ]

Likewise, the VMS remaining operating time function 128 of FIGS. 2A and 2B and FIGS. 4A and 4B may compare the predictive emergency remaining operating times t_Voltage_extrapolation_emerg, t_Temp_extrapolation_emerg, and t_SOC_extrapolation_emerg with each other to determine the predictive emergency remaining operating time 109 EESx_t_remain_emerg as follows:

EESx_t remain_emerg(z) = minimum[
t_Voltage_extrapolation_emerg(z),
t_Temp_extrapolation_emerg(z),
t_SOC_extrapolation_emerg(z) ]

Figure 9:
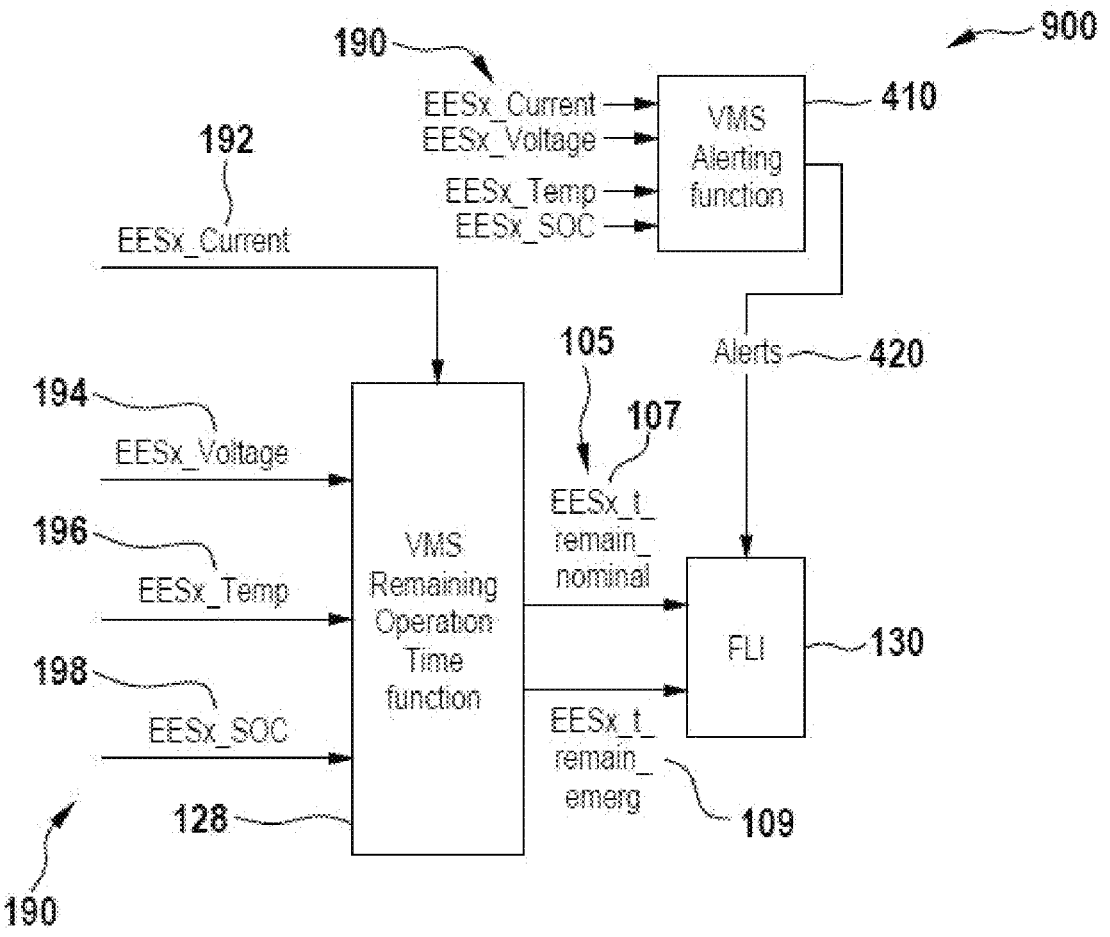
FIG. 9 shows a functional diagram of an illustrative output section of the remaining operating time determination system of FIGS. 2A and 2B and FIGS. 4A and 4B.

FIG. 9 shows an arrangement 900 with the VMS remaining operating time function 128 and the FLI 130 of FIGS. 2A and 2B and FIG. 4, as well as the VMS alerting function 410 of FIGS. 4A and 4B. The VMS remaining operating time function 128 and the VMS alerting function 410 receive and process the consolidated performance indicators 190 of FIGS. 2A and 2B and FIGS. 4A and 4B, i.e., the consolidated electric current indicator 192 EESx_Current, the consolidated voltage indicator 194 EESx_Voltage, the consolidated temperature indicator 196 EESx_Temp, and the consolidated SOC indicator 198 EESx_SOC.

More specifically, as described above at FIGS. 4A and 4B the VMS alerting function 410 may check the validity of the consolidated performance indicators 190 and, furthermore, compare the consolidated performance indicators 190 with associated limit values for generating the alerts 420. This may e.g., be performed as follows:

```
IF{
(EESx_Voltage(z) < V_nom_limit) OR (EESx_Voltage(z) ==
INVALID)
    EESx_Voltage_alert(z) = TRUE; }
ELSE{
    EESx_Voltage_alert(z) = FALSE;}
IF{
(EESx_Temp(z) > T_nom_limit) OR (EESx_Temp(z) == INVALID)
    EESx_Temp_alert(z) = TRUE; }
ELSE{
    EESx_Temp_alert(z) = FALSE;}
IF{
(EESx_SOC(z) < SOC_nom_limit) OR (EESx_SOC(z) == INVALID)
    EESx_SOC_alert(z) = TRUE; }
ELSE{
    EESx_SOC_alert(z) = FALSE;}
```

Thus, the FLI 130 may monitor and depict flight limitations based on the consolidated performance indicators 190, which are directly derived from measured values, i.e., from the main performance parameters 153 and the auxiliary performance parameters 158 of FIGS. 2A and 2B and FIGS. 4A and 4B. The consolidated performance indicators 190 are ensuring highest availability and integrity of EESx limitations on one side.

However, as described above at FIGS. 2A and 2B the FLI 130 may in addition, or alternatively, monitor and depict flight limitations based on the predictive nominal remaining operating time 107 EESx_t_remain_nominal and the predictive emergency remaining operating time 109 EESx_t_remain_emerg of FIGS. 2A and 2B and FIGS. 4A and 4B, which are extrapolated and computed by the VMS remaining operating time function 128, as described above. The predictive nominal remaining operating time 107 EESx_t_remain_nominal and the predictive emergency remaining operating time 109 EESx_t_remain_emerg are ensuring predictive operator behavior and support anticipation, planning and decision-making during a given flight mission.

Figure 10A:
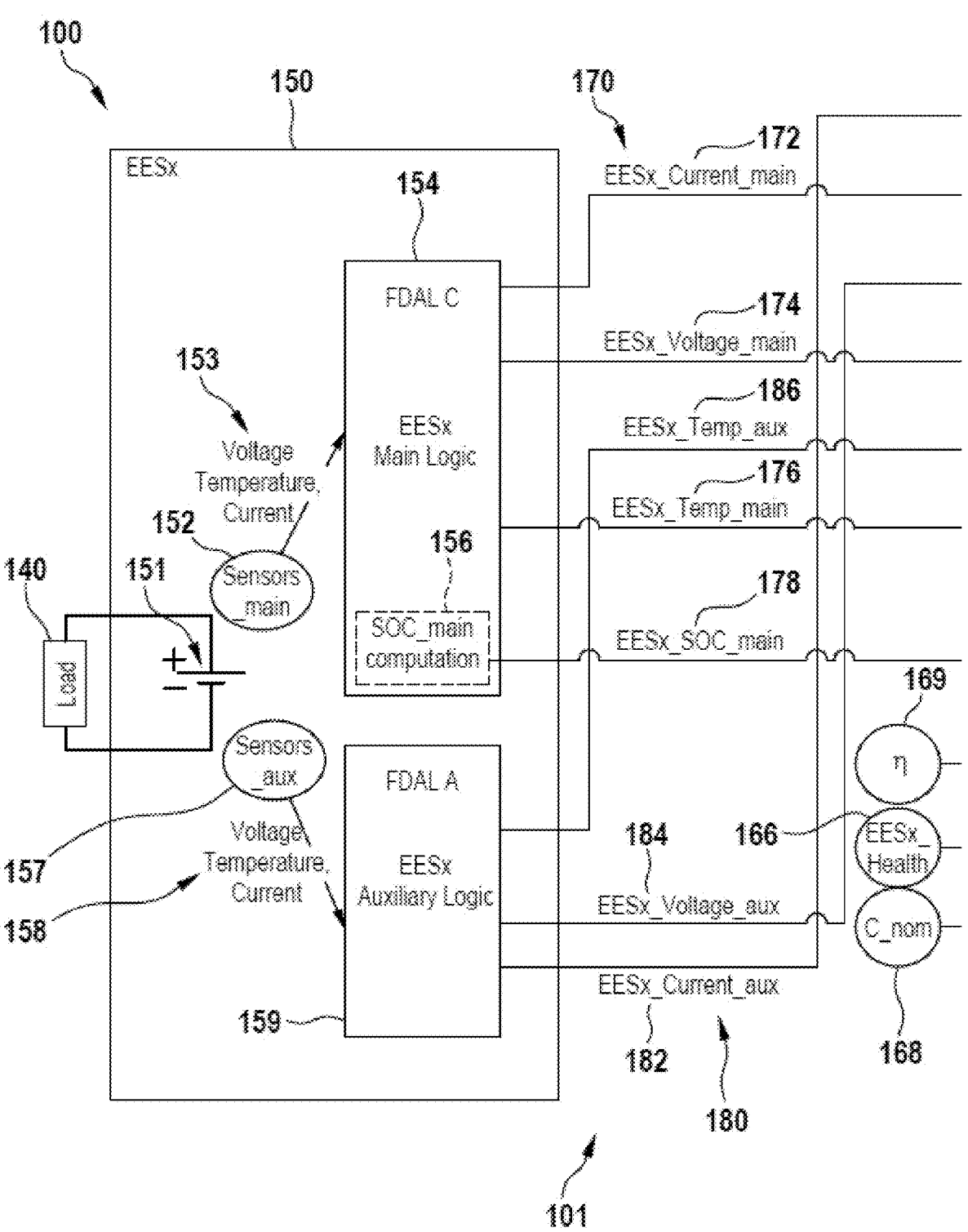
FIGS. 10A and 10B show functional diagrams of the remaining operating time determination system of FIGS. 2A and 2B with the output section of FIG. 9.
Figure 10B:
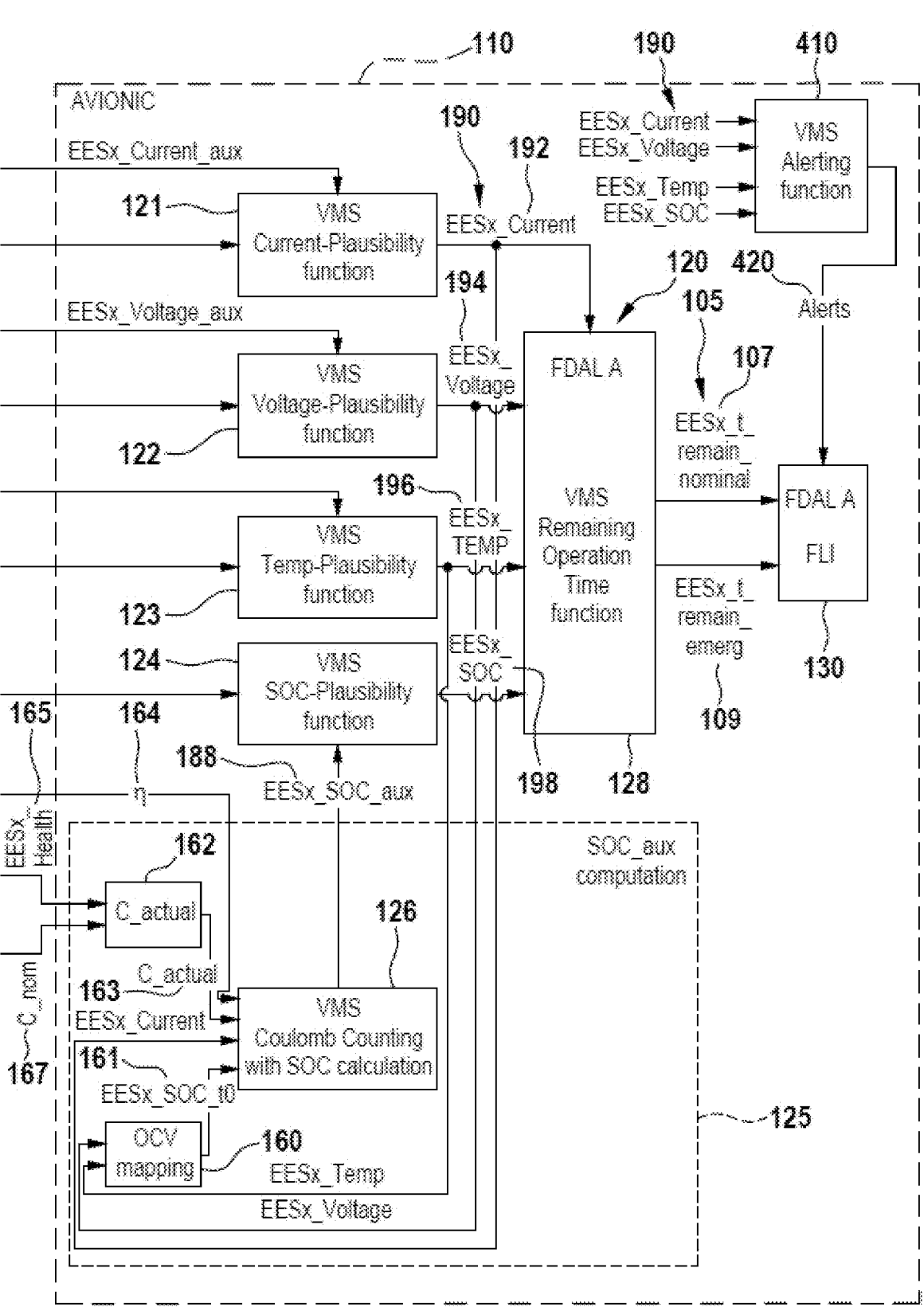

FIGS. 10A and 10B show the remaining operating time determination system 100 of FIGS. 2A and 2B with the electrical load 140, the EESx 150, and the components of the avionic system 110 which comprise according to FIGS. 2A and 2B the FLI 130 and the VMS 120 that implements the VMS current plausibility function 121, the VMS voltage plausibility function 122, the VMS temperature plausibility function 123, the VMS SOC plausibility function 124, the VMS computation unit 125, and the VMS remaining operating time function 128. More specifically, the remaining operating time determination system 100 is configured according to FIGS. 2A and 2B for performing the method 101 of determining a remaining operating time of the EESx 150, which preferably comprises determining the predictive remaining operating times 105, i.e., the predictive nominal remaining operating time 107 EESx_t_remain_nominal and the predictive emergency remaining operating time 109 EESx_t_remain_emerg. As described above at FIGS. 2A and 2B, the predictive remaining operating times 105 are determined based on the consolidated performance indicators 190, i.e., the consolidated electric current indicator 192 EESx_Current, the consolidated voltage indicator 194 EESx_Voltage, the consolidated temperature indicator 196 EESx_Temp, and the consolidated SOC indicator 198 EESx_SOC.

However, in contrast to FIGS. 2A and 2B the VMS 120 now implements in addition the VMS alerting function 410 of FIGS. 4A and 4B and FIG. 9 that also receives the consolidated performance indicators 190, i.e., the consolidated electric current indicator 192 EESx_Current, the consolidated voltage indicator 194 EESx_Voltage, the consolidated temperature indicator 196 EESx_Temp, and the consolidated SOC indicator 198 EESx_SOC. As described above at FIGS. 4A and 4B and FIG. 9, the VMS alerting function 410 may check the validity of the consolidated performance indicators 190 and, furthermore, compare the consolidated performance indicators 190 with associated limit values for generating the alerts 420 which are transmitted to the FLI 130.

It should be noted that the above described embodiments are merely described to illustrate possible realizations of the present invention, but not in order to restrict the present disclosure thereto. Instead, multiple modifications and variations of the disclosure are possible and should, therefore, also be considered as being part of the invention.

REFERENCE LIST 1 rotary wing aircraft
1a multi-blade main rotor
1b, 1c rotor blades
1d rotor head
1e rotor shaft
2 fuselage
2a cabin
2b rear fuselage
3 tail boom
3a horizontal stabilizer
4 counter-torque device
4a tail rotor
5 fin
100 remaining operating time determination system
101 method
105 remaining operating time 107 predictive nominal remaining operating time
109 predictive emergency remaining operating time
110 avionic system
120 VMS
121 VMS current plausibility function
122 VMS voltage plausibility function
123 VMS temperature plausibility function
124 VMS SOC plausibility function
125 VMS SOC computation unit
126 VMS SOC calculator
128 VMS remaining operating time function
130 FLI
140 electric load
150 EESx
151 energy source
152 main sensor arrangement
153 main performance parameters
154 main computation unit
156 main SOC computation unit
157 auxiliary sensor arrangement
158 auxiliary performance parameters
159 auxiliary computation unit
160 OCV mapping
161 initial SOC value
162 remaining energy source capacity determination function
163 remaining energy source capacity value
164 constant coulombic efficiencies
165 predetermined health value
166 health values table
167 nominal capacity value
168 nominal capacity values table
169 coulombic efficiencies table
170 main performance indicators
172 main electric current value
174 main voltage value
176 main temperature
178 main SOC value
180 auxiliary performance indicators
182 auxiliary electric current value
184 auxiliary voltage value
186 auxiliary temperature
188 auxiliary SOC value
190 consolidated performance indicators
192 consolidated electric current indicator
194 consolidated voltage indicator
196 consolidated temperature indicator
198 consolidated SOC indicator
300 EESx with external sensor arrangement
310 external sensor arrangement
322 internal temperature sensor
324 external voltage/current sensors
400 EESx with external sensor arrangement
405 external sensor arrangement
406 first external computation unit
407 second external computation unit
410 VMS alerting function
420 alerts
480 additional auxiliary performance indicators
482 additional auxiliary electric current value
484 additional auxiliary voltage value
486 additional auxiliary temperature
500 load extrapolating scenarios
510 normal load case scenario
512 actual power request
520 emergency load case scenario
522 predefined emergency power request

600 consolidated voltage diagram
602 ordinate with voltage values
604 abscissa with time values
610 consolidated voltage indicators curve
612, 614 time intervals
623, 627 further normal developing
625, 629 further emergency developing
632 predefined nominal voltage limit
634 predefined emergency voltage limit
642 predictive nominal remaining operating time
644 predictive emergency remaining operating time
700 consolidated temperature diagram
702 ordinate with temperature values
704 abscissa with time values
710 consolidated temperature indicators curve
712, 714 time intervals
723, 727 further normal developing
725, 729 further emergency developing
732 predefined nominal temperature limit
734 predefined emergency temperature limit
742 predictive nominal remaining operating time
744 predictive emergency remaining operating time
800 consolidated SOC diagram
802 ordinate with SOC values
804 abscissa with time values
810 consolidated SOC indicators curve
812, 814 time intervals
823, 827 further normal developing
825, 829 further emergency developing
832 predefined nominal SOC limit
834 predefined emergency SOC limit
842 predictive nominal remaining operating time
844 predictive emergency remaining operating time
900 output section

What is claimed is:

1. A method of determining a remaining operating time of an electrical energy storage unit in an aircraft, comprising:

using a first sensor arrangement that is assembled with the electrical energy storage unit for measuring first performance parameters of the electrical energy storage unit;

using a first computation unit that is assembled with the electrical energy storage unit for determining first performance indicators based on the first performance parameters;

using at least one second sensor arrangement that is associated with the electrical energy storage unit for measuring second performance parameters of the electrical energy storage unit;

using at least one second computation unit that is associated with the electrical energy storage unit for determining second performance indicators based on the second performance parameters;

using a vehicle management system of the aircraft for:

comparing the first performance indicators with the second performance indicators to determine consolidated performance indicators, comprising, for each one of the first performance indicators:

determining whether a difference between the first performance indicator and an associated one of the second performance indicators lies within a predetermined performance tolerance, if the difference between the first performance indicator and an associated one of the second performance indicators lies inside of the predetermined performance tolerance, setting the first performance indicator as consolidated performance indicator, and if the difference between the first performance indicator and an associated one of the second performance indicators lies outside of the predetermined performance tolerance, invalidating the first performance indicator and the associated one of the second performance indicators; and determining predictive remaining operating times of the electrical energy storage unit based on the consolidated performance indicators, wherein the predictive remaining operating times comprise at least a predictive nominal remaining operating time and a predictive emergency remaining operating time.

2. The method of claim 1, wherein the first performance parameters of the electrical energy storage unit comprise at least a first electric current, a first voltage and a first temperature of the electrical energy storage unit.

3. The method of claim 2, wherein the first performance indicators comprise at least a first electric current value derived from the first electric current, a first voltage value derived from the first voltage, and a first temperature value derived from the first temperature.

4. The method of claim 1, wherein the second performance parameters of the electrical energy storage unit comprise at least a second electric current, a second voltage, and a second temperature of the electrical energy storage unit.

5. The method of claim 4, wherein the second performance indicators comprise at least a second current value derived from the second electric current, a second voltage value derived from the second voltage, and a second temperature value derived from the second temperature.

6. The method of claim 1, wherein using the first sensor arrangement for measuring the first performance parameters of the electrical energy storage unit and using the at least one second sensor arrangement for measuring the second performance parameters of the electrical energy storage unit is performed simultaneously and repeatedly at predetermined time intervals, and wherein the first performance indicators and the second performance indicators are provided with respective time stamps.

7. The method of claim 1, wherein the vehicle management system repeatedly determines the consolidated performance indicators at predetermined time intervals during operation of the aircraft.

8. The method of claim 1, further comprising:

using the first computation unit for determining a first state-of-charge value based on the first performance parameters; and using the vehicle management system of the aircraft for determining a second state-of-charge value based on the consolidated performance indicators.

9. The method of claim 8, wherein comparing the first performance indicators with the second performance indicators to determine the consolidated performance indicators comprises comparing the first state-of-charge value with the second state-of-charge value.

10. The method of claim 9, wherein comparing the first state-of-charge value with the second state-of-charge value comprises:

determining whether a difference between the first state-of-charge value and the second state-of-charge value lies within a predetermined state-of-charge tolerance, if the difference between the first state-of-charge value and the second state-of-charge value lies inside of the predetermined state-of-charge tolerance, setting the first state-of-charge value as consolidated state-of-charge indicator, and

if the difference between the first state-of-charge value and the second state-of-charge value lies outside of the predetermined state-of-charge tolerance, invalidating the first state-of-charge value and the second state-of-charge value.

11. The method of claim 1, wherein using the vehicle management system of the aircraft for determining the predictive remaining operating times of the electrical energy storage unit based on the consolidated performance indicators comprises for each one of the consolidated performance indicators:

determining a first further developing of the consolidated performance indicator by extrapolating the consolidated performance indicator assuming a normal load case determined on the basis of an actual power request from the electrical energy storage unit; and determining a second further developing of the consolidated performance indicator by extrapolating the consolidated performance indicator assuming an emergency load case determined on the basis of a predefined emergency power request from the electrical energy storage unit.

12. The method of claim 11, wherein using the vehicle management system of the aircraft for determining the predictive remaining operating times of the electrical energy storage unit based on the consolidated performance indicators further comprises for each one of the consolidated performance indicators:

correlating the first further developing of the consolidated performance indicator with a predefined nominal limit of the consolidated performance indicator for determining the predictive nominal remaining operating time of the electrical energy storage unit; and correlating the second further developing of the consolidated performance indicator with a predefined emergency limit of the consolidated performance indicator for determining the predictive emergency remaining operating time of the electrical energy storage unit.

13. The method of claim 1, further comprising:

using the vehicle management system for:

generating display indications associated with the predictive nominal remaining operating time of the electrical energy storage unit and the predictive emergency remaining operating time of the electrical energy storage unit; and providing the display indications to a first limit indicator of the aircraft for display.

14. The method of claim 1, further comprising:

using the vehicle management system for generating alerts associated with the predictive nominal remaining operating time of the electrical energy storage unit and the predictive emergency remaining operating time of the electrical energy storage unit.

15. The method of claim 14, wherein using the vehicle management system for generating alerts associated with the predictive nominal remaining operating time of the electrical energy storage unit and the predictive emergency remaining operating time of the electrical energy storage unit comprises: using the consolidated performance indicators for generating the alerts.

16. The method of claim 1, wherein the vehicle management system performs the comparing and determining steps automatically during operation of the aircraft without operator intervention.

17. The method of claim 1, wherein the first sensor arrangement and the second sensor arrangement measure at least one common physical parameter of the electrical energy storage unit and the comparison is performed between performance indicators derived from the common parameter.

18. A method of determining a remaining operating time of an electrical energy storage unit in an aircraft, comprising:

using a first sensor arrangement assembled with the electrical energy storage unit to measure first performance parameters of the electrical energy storage unit;

using a first computation unit assembled with the electrical energy storage unit to determine first performance indicators based on the first performance parameters;

using a second sensor arrangement associated with the electrical energy storage unit to measure second performance parameters of the electrical energy storage unit;

using a second computation unit associated with the electrical energy storage unit to determine second performance indicators based on the second performance parameters;

using a vehicle management system of the aircraft to:

compare the first performance indicators with the second performance indicators to determine consolidated performance indicators, comprising, for each one of the first performance indicators; and determine whether a difference between the first performance indicator and an associated one of the second performance indicators lies within a predetermined performance tolerance, if the difference between the first performance indicator and an associated one of the second performance indicators lies inside of the predetermined performance tolerance, setting the first performance indicator as consolidated performance indicator, and if the difference between the first performance indicator and an associated one of the second performance indicators lies outside of the predetermined performance tolerance, invalidating the first performance indicator and the associated one of the second performance indicators; and determine predictive remaining operating times of the electrical energy storage unit based on the consolidated performance indicators, wherein the predictive remaining operating times comprise a predictive nominal remaining operating time and a predictive emergency remaining operating time.

19. The method of claim 18, wherein the second performance parameters of the electrical energy storage unit comprise a second electric current, a second voltage, and a second temperature of the electrical energy storage unit, and wherein the second performance indicators comprise a second current value derived from the second electric current, a second voltage value derived from the second voltage, and a second temperature value derived from the second temperature.

20. The method of claim 18, wherein the first performance parameters of the electrical energy storage unit comprise a first electric current, a first voltage and a first temperature of the electrical energy storage unit, and wherein the first performance indicators comprise a first electric current value derived from the first electric current, a first voltage value derived from the first voltage, and a first temperature value derived from the first temperature.

* * * * *